(12) United States Patent
Han et al.

(10) Patent No.: US 8,971,874 B2
(45) Date of Patent: Mar. 3, 2015

(54) METHODS AND APPARATUS FOR TESTING ELECTRONIC DEVICES UNDER SPECIFIED RADIO-FREQUENCY VOLTAGE AND CURRENT STRESS

(71) Applicant: Apple Inc., Cupertino, CA (US)

(72) Inventors: Liang Han, Sunnyvale, CA (US);
Matthew A. Mow, Los Altos, CA (US);
James G. Judkins, Campbell, CA (US);
Thomas E. Biedka, San Jose, CA (US);
Ming-Ju Tsai, Cupertino, CA (US);
Robert W. Schlub, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 159 days.

(21) Appl. No.: 13/873,048

(22) Filed: Apr. 29, 2013

(65) Prior Publication Data

US 2014/0302797 A1 Oct. 9, 2014

Related U.S. Application Data

(60) Provisional application No. 61/809,806, filed on Apr. 8, 2013.

(51) Int. Cl.
*H04W 24/00* (2009.01)
*H04W 24/06* (2009.01)

(52) U.S. Cl.
CPC .................... *H04W 24/06* (2013.01)
USPC ........ 455/425; 455/423; 455/424; 455/67.11; 455/67.13; 455/67.14; 455/115.1; 455/226.1; 324/750.01

(58) Field of Classification Search
USPC ........ 455/423, 424, 425, 67.11, 67.13, 67.14, 455/67.15, 67.7, 115.1–115.4, 455/226.1–226.4; 324/750.01, 612, 613, 324/614, 519–523, 525, 527, 750.15
See application file for complete search history.

(56) References Cited

U.S. PATENT DOCUMENTS

| | | | | |
|---|---|---|---|---|
| 6,362,614 | B2 * | 3/2002 | Draving | 324/72.5 |
| 6,861,846 | B2 * | 3/2005 | Anderson | 324/623 |
| 7,123,023 | B2 * | 10/2006 | Minihold et al. | 324/624 |
| 7,127,363 | B2 * | 10/2006 | Loyer | 702/57 |
| 7,500,158 | B1 * | 3/2009 | Smith et al. | 714/708 |

(Continued)

OTHER PUBLICATIONS

Han et al., U.S. Appl. No. 13/494,663, filed Jun. 12, 2012.

(Continued)

*Primary Examiner* — Tuan A Tran
(74) *Attorney, Agent, or Firm* — Treyz Law Group; Jason Tsai

(57) ABSTRACT

Test systems for characterizing devices under test (DUTs) are provided. A test system for testing a DUT in a shunt configuration may include a signal generator and a matching network that is coupled between the signal generator and the DUT and that is optimized to apply desired voltage/current stress to the DUT with reduced source power. The matching network may be configured to provide matching and desired stress levels at two or more frequency bands. In another suitable embodiment, a test system for testing a DUT in a series configuration may include a signal generator, an input matching network coupled between the DUT and a first terminal of the DUT, and an output matching network coupled between the DUT and a second terminal of the DUT. The input and output matching network may be optimized to apply desired voltage/current stress to the DUT with reduced source power.

22 Claims, 22 Drawing Sheets

(56) References Cited

U.S. PATENT DOCUMENTS

| | | | |
|---|---|---|---|
| 7,804,304 B2 * | 9/2010 | Held | 324/614 |
| 7,816,926 B2 | 10/2010 | Benedikt et al. | |
| 7,975,190 B2 * | 7/2011 | Smith et al. | 714/708 |
| 8,036,616 B2 * | 10/2011 | Brueckler | 455/226.1 |
| 8,150,351 B2 | 4/2012 | Shah et al. | |
| 8,244,234 B2 * | 8/2012 | Zhu et al. | 455/423 |
| 8,358,147 B2 | 1/2013 | Pagani | |
| 8,437,715 B2 * | 5/2013 | Flickinger et al. | 455/150.1 |
| 8,588,763 B2 * | 11/2013 | Venkataraman | 455/423 |
| 8,600,311 B2 * | 12/2013 | Gregg et al. | 455/67.12 |
| 8,676,188 B2 * | 3/2014 | Olgaard | 455/423 |
| 2004/0207426 A1 | 10/2004 | Tsironis | |
| 2009/0167336 A1 * | 7/2009 | La Rosa et al. | 324/763 |
| 2009/0261841 A1 * | 10/2009 | Ohashi | 324/537 |
| 2013/0060501 A1 | 3/2013 | Huang | |

OTHER PUBLICATIONS

Han et al., U.S. Appl. No. 13/466,017, filed May 7, 2012.

* cited by examiner

| TEST SCENARIO | BAND 1 | BAND 2 | MATCHING NETWORK TOPOLOGY |
|---|---|---|---|
| #1 | V | V | $M_{V1} + M_{V2}$ |
| #2 | I | I | $M_{I1} + M_{I2}$ |
| #3 | V | I | $M_{V1} + M_{I2}$ |
| #4 | I | V | $M_{I1} + M_{V2}$ |
| #5 | V,I | V,I | $M_{VI1} + M_{VI2}$ |

FIG. 13

METHODS AND APPARATUS FOR TESTING ELECTRONIC DEVICES UNDER SPECIFIED RADIO-FREQUENCY VOLTAGE AND CURRENT STRESS

This application claims the benefit of provisional patent application No. 61/809,806, filed Apr. 8, 2013, which is hereby incorporated by reference herein in its entirety.

BACKGROUND

This relates generally to electronic devices, and more particularly, to electronic devices with wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too small, the antenna will not be able to cover all communications bands of interest.

In view of these considerations, it would be desirable to provide antenna tuning elements that allow the antenna to cover a wider range of frequency bands. Moreover, it may be desirable to provide ways for characterizing the performance of such types of tuning elements.

SUMMARY

This relates generally to a radio-frequency test system that can be used for characterizing devices under test (DUTs) such as antenna tuning elements.

In one suitable arrangement, the test system may include a signal generator that outputs radio-frequency test signals in a given frequency band to the DUT. The test system may also include matching network circuitry that is interposed between the signal generator and the DUT and that is configured to apply a first predetermined amount of stress to the DUT in the given frequency band. In this arrangement, the DUT may be tested in a shunt configuration. The matching network circuitry is optimized such that stress levels in frequency bands other than the given frequency band are less than or equal to the first predetermined amount of stress.

Either radio-frequency voltage stress or current stress may be applied to the DUT. The DUT may be placed in one state when operating in the given frequency band and may be placed in another state when operating the some other frequency band. The matching network circuitry may also be optimized to apply a second predetermined amount of stress to the DUT in the other frequency band such that stress levels in frequency bands outside the other frequency band are at most equal to the second predetermined amount of stress. The matching network circuitry may include a first matching circuit that serves to provide matching in the given frequency band and a second cascaded matching circuit that serves to provide matching in the other frequency band.

In another suitable arrangement, the test system may include a signal generator that outputs radio-frequency test signals at a given frequency to the device under test, input matching network circuitry coupled between the signal generator and a first terminal of the DUT, and output matching network circuitry coupled to a second terminal of the DUT. In this arrangement, the DUT may be tested in a series configuration. The input matching network may be optimized to apply a first predetermined amount of RF voltage/current stress to the first terminal of the DUT at the given frequency, whereas the output matching network may be optimized to apply a second predetermined amount of RF voltage/current stress to the second terminal of the DUT at the given frequency. Configured in this way, stress levels at the first terminal of the DUT at frequencies other than the given frequency are at most equal to the first predetermined amount of RF stress, and stress levels at the second terminal of the DUT at frequencies other than the given frequency are at most equal to the second predetermined amount of RF stress.

The DUT may be operable in multiple states. The DUT may be placed in a first state while being characterized at the given frequency. The DUT may be tested in a second state while being tested at another frequency that is different than the given frequency. A selected one of the input and output matching network circuitries may be configured to apply a third predetermined amount of current/voltage stress to a corresponding terminal of the DUT when the DUT is placed in the second state when operating at the another frequency.

Further features of the present invention, its nature and various advantages will be more apparent from the accompanying drawings and the following detailed description.

BRIEF DESCRIPTION OF THE DRAWINGS

FIG. 13 is a table showing different configurations suitable for applying desired radio-frequency voltage/current stress in each respective radio-frequency band of interest in accordance with an embodiment of the present invention.

DETAILED DESCRIPTION

Figure 1:
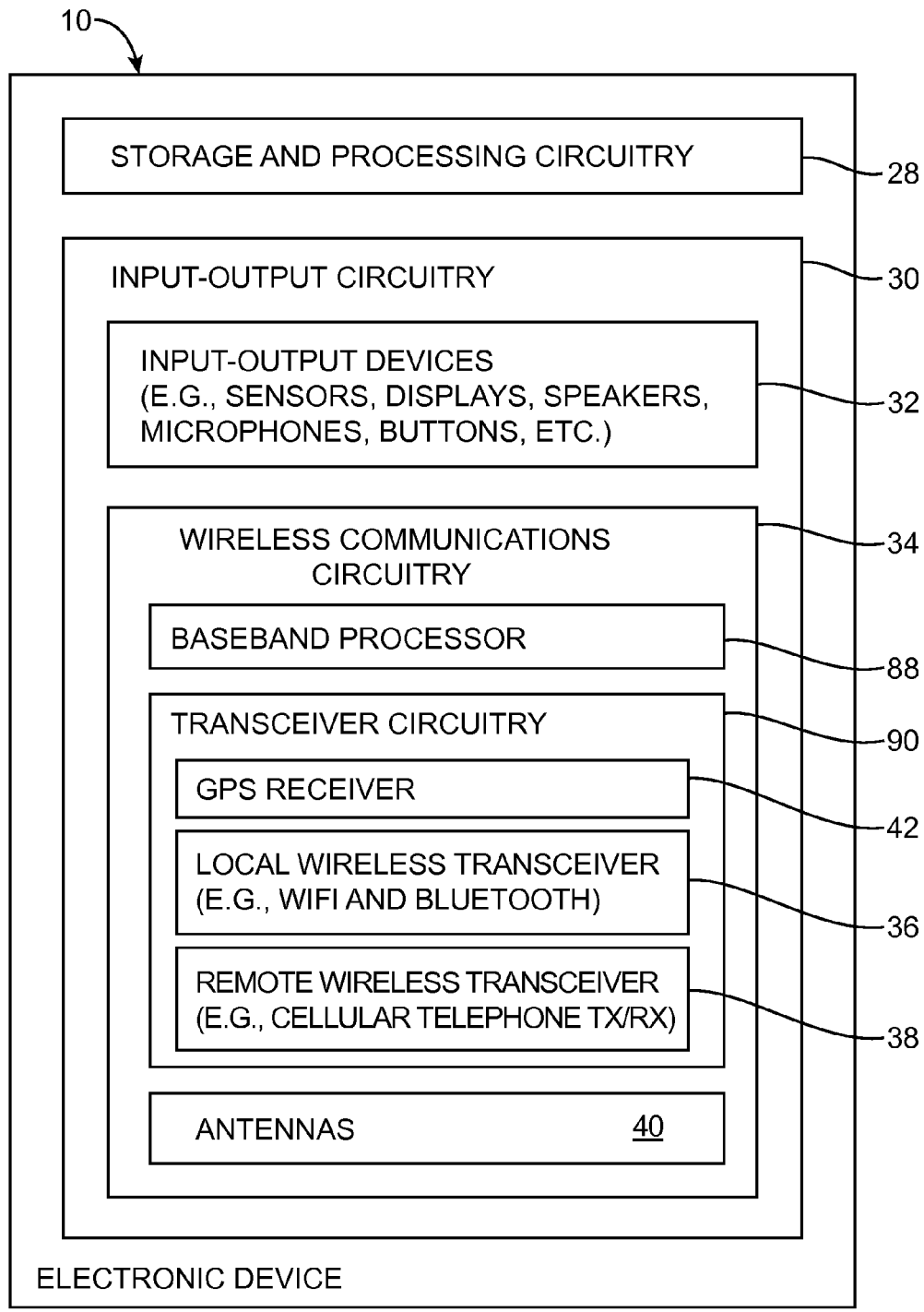
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
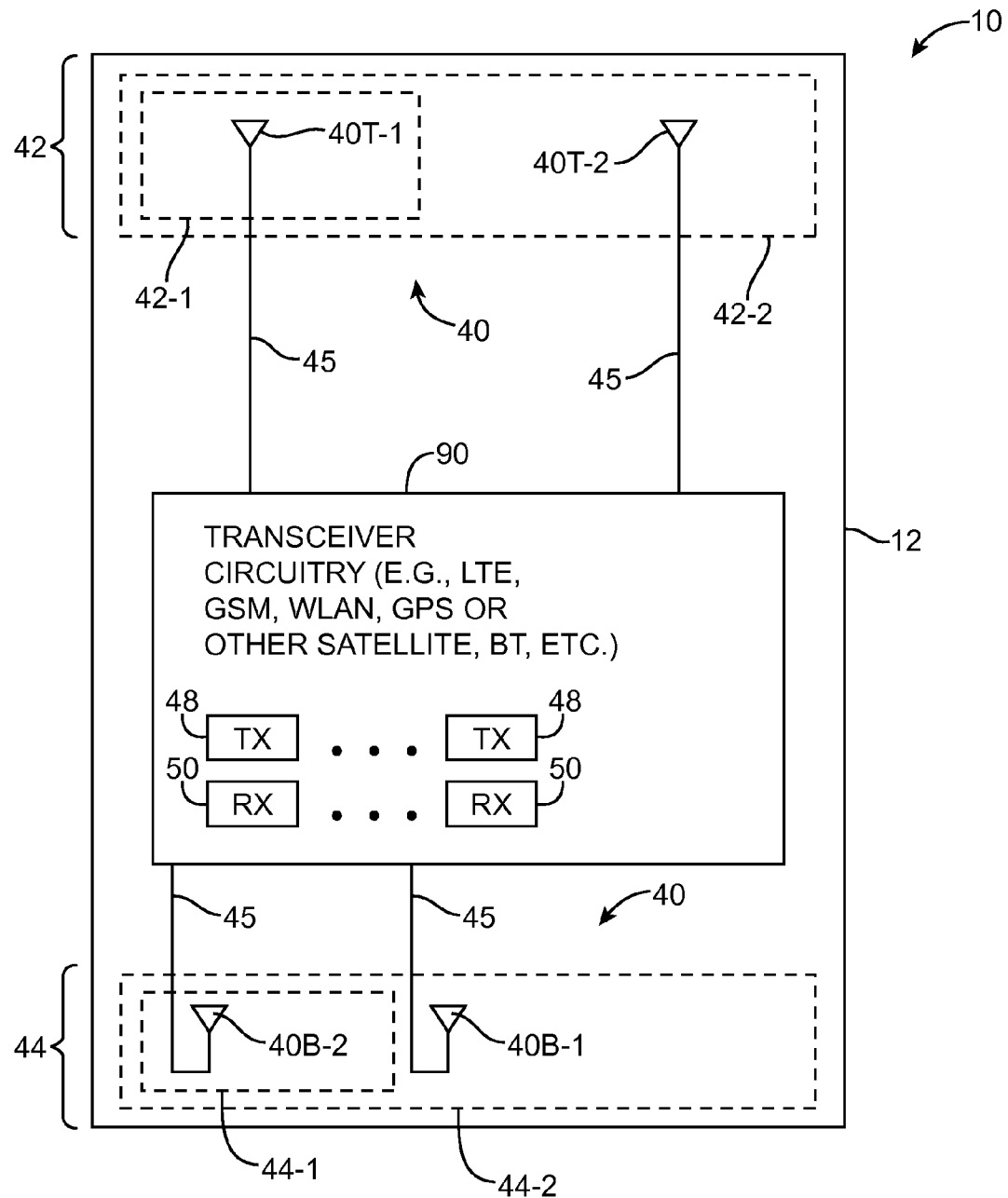
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
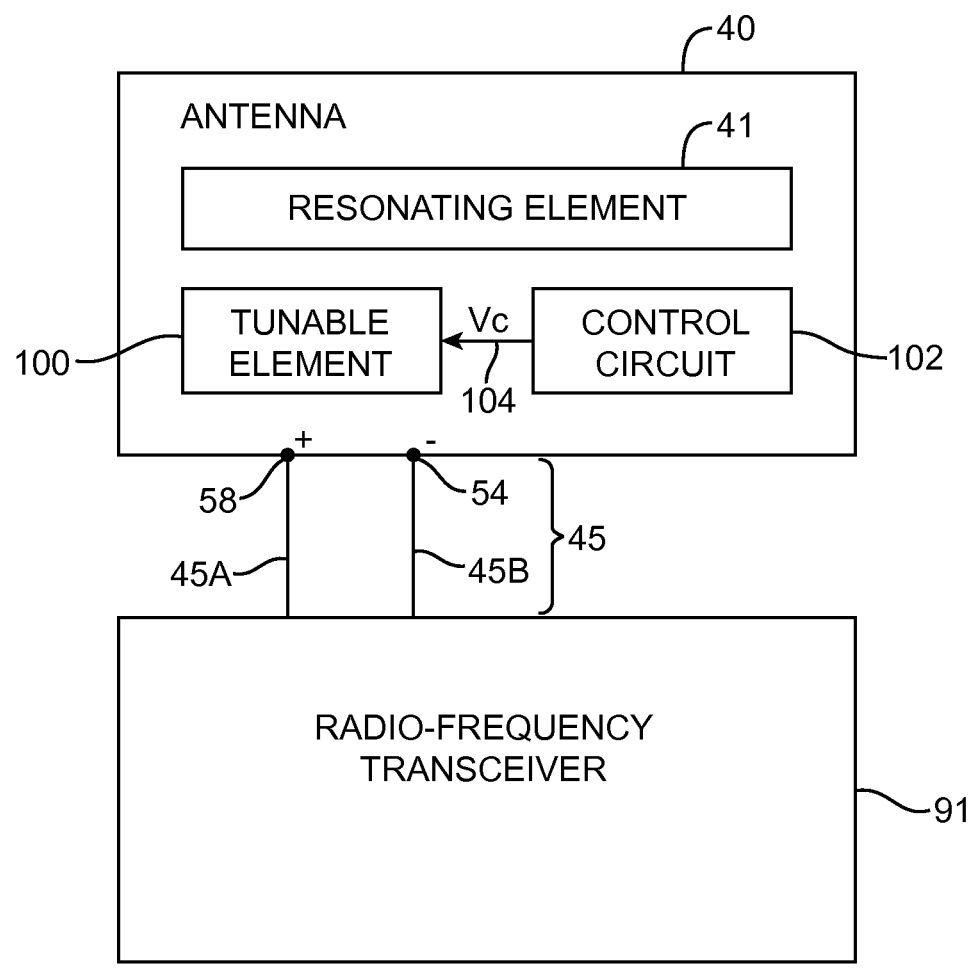
FIG. 3 is a circuit diagram showing how an antenna in the electronic device of FIG. 1 may be coupled to radio-frequency transceiver circuitry in accordance with an embodiment of the present invention.

FIG. 3 is a diagram showing how radio-frequency path 45 may be used to convey radio-frequency signals between an antenna 40 and radio-frequency transceiver 91. Antenna 40 may be one of the antennas of FIG. 2 (e.g., antenna, 40T-1, 40T-2, 40B-1, 40B-2, or other antennas). Radio-frequency transceiver 91 may include receivers and/or transmitters in transceiver circuitry 90, wireless local area network transceiver 36 (e.g., a transceiver operating at 2.4 GHz, 5 GHz, 60 GHz, or other suitable frequency), cellular telephone transceiver 38, or other radio-frequency transceiver circuitry for receiving and/or transmitting radio-frequency signals.

Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive antenna feed terminal 58 (+) that is coupled to signal path 45A and a ground antenna feed terminal 54 (−) that is coupled to ground path 45B. If desired, circuitry such as filters, impedance matching circuits, switches, amplifiers, and other radio-frequency circuits may be interposed within path 45.

As shown in FIG. 3, antenna 40 may include a resonating element 41 and antenna tuning circuitry. Resonating element 41 may be formed from a loop antenna structure, patch antenna structure, inverted-F antenna structure, slot antenna structures, planar inverted-F antenna structures, helical antenna structures, hybrids of these designs, etc. The use of antenna tuning circuitry may help device 10 cover a wider range of communications frequencies than would otherwise be possible.

In general, it is desirable for device 10 to be able to exhibit wide band coverage (e.g., for device 10 to be able to support operation in multiple frequency bands corresponding to different radio access technologies). For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). For an antenna having a given volume, a higher band coverage (or bandwidth) results in a decrease in gain (e.g., the product of maximum gain and bandwidth is constant). As a result, increasing the volume of antenna 40 will generally increase its band coverage. Increasing the volume of antennas, however, may not always be feasible if a small form factor is desired.

To satisfy consumer demand for small form factor wireless devices, one or more of antennas 40 may be provided with antenna tuning circuitry. The antenna tuning circuitry may include a radio-frequency tunable component such as tunable component (sometimes referred to as an adjustable antenna tuning element) 100 and an associated control circuitry such as control circuit 102 (see, e.g., FIG. 3). Tunable element 100 and/or control circuit 102 may sometimes be formed as an integral part of antenna resonating element 41 or as a separate discrete surface-mount component that is attached to antenna resonating element 41.

For example, antenna tuning element 100 may include switching circuitry based on one or more switches or continuously tunable load components. Control circuit 102 may be used to place tunable element 100 in the desired state by sending appropriate control signals Vc via path 104. The switching circuitry may, for example, include a switch that can be placed in an open or closed position. When the switch is placed in its open position (e.g., when control signal Vc has a first value), antenna 40 may exhibit a first frequency response. When the switch is placed in its closed position (e.g., when control signal Vc has a second value that is different than the first value), antenna 40 may exhibit a second frequency response. By using an antenna tuning scheme of this type, a relatively narrow bandwidth (and potentially compact) design can be used for antenna 40, if desired.

Figure 4A:
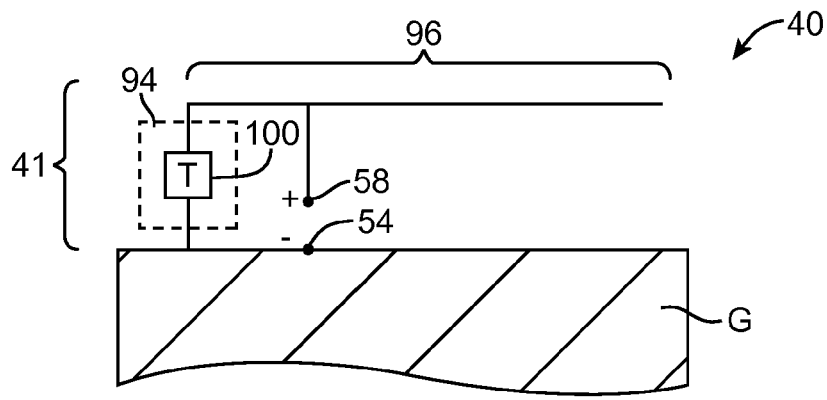
FIGS. 4A, 4B, and 4C are schematic diagrams of an illustrative inverted-F antenna containing antenna tuning elements in accordance with an embodiment of the present invention.

In one suitable embodiment of the present invention, antenna 40 may be an inverted-F antenna. FIG. 4A is a schematic diagram of an inverted-F antenna that may be used in device 10. As shown in FIG. 4A, inverted-F antenna 40 may have an antenna resonating element such as antenna resonating element 41 and a ground structure such as ground G. Antenna resonating element 41 may have a main resonating element arm such as arm 96. Short circuit branch such as shorting path 94 may couple arm 96 to ground G. An antenna feed may contain positive antenna feed terminal 58 (+) and ground antenna feed terminal 54 (−). Positive antenna feed terminal 58 may be coupled to arm 96, whereas ground antenna feed terminal 54 may be coupled to ground G. Arm 96 in the FIG. 4A example is shown as being a single straight segment. This is merely illustrative. Arm 96 may have multiple bends with curved and/or straight segments, if desired.

In the example of FIG. 4A, inverted-F antenna 40 may include an antenna tuning element 100 interposed in shorting path 94. Antenna tuning element 100 may, for example, be a switchable impedance matching network, a switchable inductive network, a continuously tunable capacitive circuit, etc.

Figure 4B:
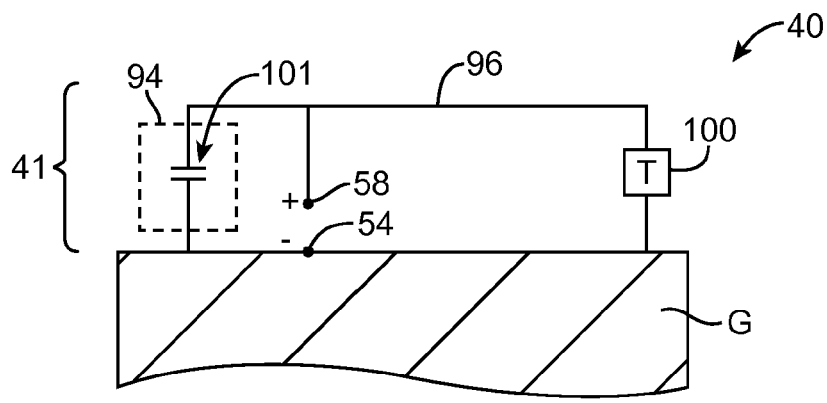

In another suitable arrangement of the present invention, resonating element 41 of inverted-F antenna 40 may include an antenna tuning element 100 coupled between the extended portion of resonating arm 96 and ground G (see, e.g., FIG. 4B). In such an arrangement, a capacitive structure such as capacitor 101 may be interposed in shorting path 94 so that antenna tuning circuit 100 is not shorted to ground at low frequencies. In the example of FIG. 4B, antenna tuning element 100 may be a switchable inductor, a continuously tunable capacitive/resistive circuit, etc.

Figure 4C:
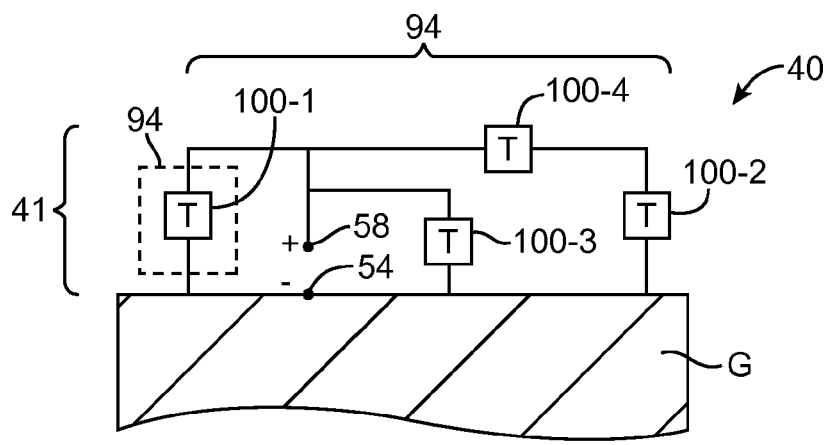

In general, antenna 40 may include any number of antenna tuning elements 100. As shown in FIG. 4C, short circuit branch 94 may include at least one tunable element 100-1 that couples arm 96 to ground. Tunable element 100-1 may be a switchable inductive path, as an example (e.g., element 100-1 may be activated to short arm 96 to ground). If desired, antenna tuning element 100-3 may be coupled in parallel with the antenna feed between positive antenna feed terminal 58 and ground feed terminal 54. Tunable element 100-3 may be an adjustable impedance matching network circuit, as an example.

As another example, antenna tuning element 100-4 may be interposed in antenna resonating arm 96. Antenna tuning element 100-4 may be a continuously adjustable variable capacitor (as an example). If desired, additional tuning elements such tuning element 100-2 (e.g., continuously tunable or semi-continuously tunable capacitors, switchable inductors, etc.) may be coupled between the extended portion of arm 96 to ground G.

The placement of these tuning circuits 100 in FIGS. 4A, 4B, and 4C is merely illustrative and do not serve to limit the scope of the present invention. Additional capacitors and/or inductors may be added to ensure that each antenna tuning circuit 100 is not shorted circuited to ground at low frequencies (e.g., frequencies below 100 MHz). In general, antennas 40 in device 10 may include antennas with resonating elements that are formed from loop antenna structures, patch antenna structures, inverted-F antenna structures, slot antenna structures, planar inverted-F antenna structures, helical antenna structures, hybrids of these designs, etc. At least a portion of antennas 40 in device 10 may contain at least one antenna tuning element 100 (formed at any suitable location on the antenna) that can be adjusted so that wireless circuitry 34 may be able to cover the desired range of communications frequencies.

Figure 5A:
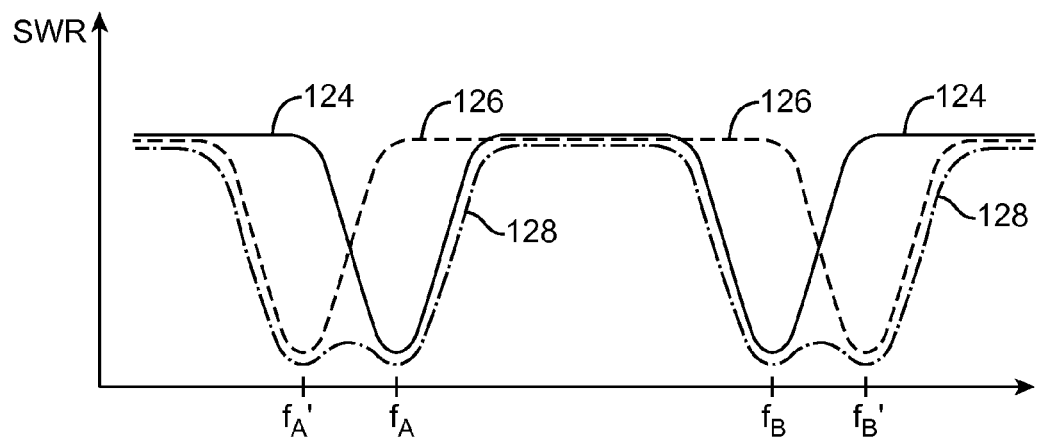
FIGS. 5A and 5B are plots showing how antennas containing tuning elements may be used to cover multiple communications bands of interest in accordance with an embodiment of the present invention.

By dynamically controlling antenna tuning elements 100, antenna 40 may be able to cover a wider range of radio-frequency communications frequencies than would otherwise be possible. A standing-wave-ratio (SWR) versus frequency plot such as SWR plot of FIG. 5A illustrates the band tuning capability for antenna 40. As shown in FIG. 5A, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning elements 100 of antenna 40 may be placed in a first configuration (e.g., antenna tuning elements 100 may be provided with a first set of control signals).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning elements 100 may be placed in a second configuration that is different than the first configuration (e.g., antenna tuning circuits 100 may be provided with a second set of control signals that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning elements 100 may be placed in a third configuration that is different than the first and second configurations (e.g., antenna tuning elements 100 may be provided with a third set of control signals that is different than the first and second sets of control signals). A combination of tuning methods may be used so that the resonance curve 128 exhibits broader frequency ranges than curves 124 and 126.

Figure 5B:
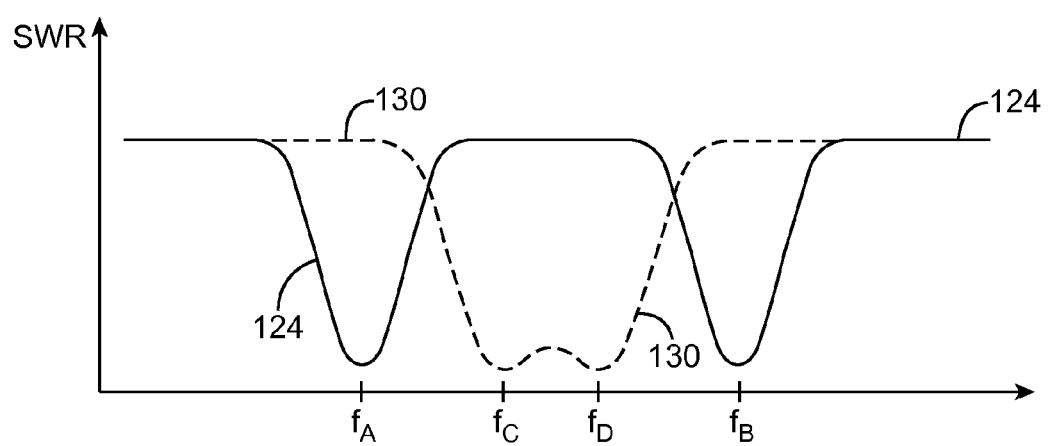

In another suitable arrangement, antenna 40 may be placed in a fourth antenna tuning mode in which antenna 40 exhibits satisfactory resonant peaks at mid-band frequencies $f_C$ and $f_D$ (e.g., to cover frequencies between the low and high bands), as shown by SWR characteristic curve 130 of FIG. 5B. In the fourth antenna tuning mode, the antenna tuning circuits 100 may yet be placed in another different configuration. The SWR curves of FIGS. 5A and 5B are merely illustrative and do not serve to limit the scope of the present invention. In general, antenna(s) 40 may include antenna tuning circuits 100 that enable device 10 to transmit and receive wireless signals in any suitable number of radio-frequency communications bands.

Figure 6A:
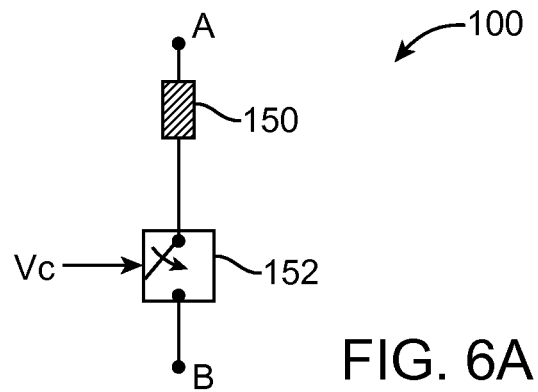
FIGS. 6A and 6B are circuit diagrams of illustrative switchable load circuits that may be used as antenna tuning elements in accordance with an embodiment of the present invention.

Antenna tuning element 100 may be any switchable or tunable electrical component that can be adjusted in real time. Antenna tuning element 100 may have a first terminal A and a second terminal B that may be coupled to desired locations on antenna resonating element 41 and a third terminal operable to receive control signal Vc from control circuit 102. FIG. 6A shows one suitable circuit implementation of tunable element 100. As shown in FIG. 6A, element 100 may include a radio-frequency switch 152 and a load circuit 150 coupled in series between terminals A and B. Switch 152 may be implemented using a p-i-n diode, a gallium arsenide field-effect transistor (FET), a microelectromechanical systems (MEMs) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. The state of the switch can be controlled using signal Vc generated from control circuit 102 (see, e.g., FIG. 3). For example, a high Vc will turn on or close switch 152 whereas a low Vc will turn off or open switch 152.

Load circuit 150 may be formed from one or more electrical components. Components that may be used as all or part of circuit 150 include resistors, inductors, and capacitors. Desired resistances, inductances, and capacitances for circuit 150 may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board. In certain embodiments, load circuit 150 need not be used.

Figure 6B:
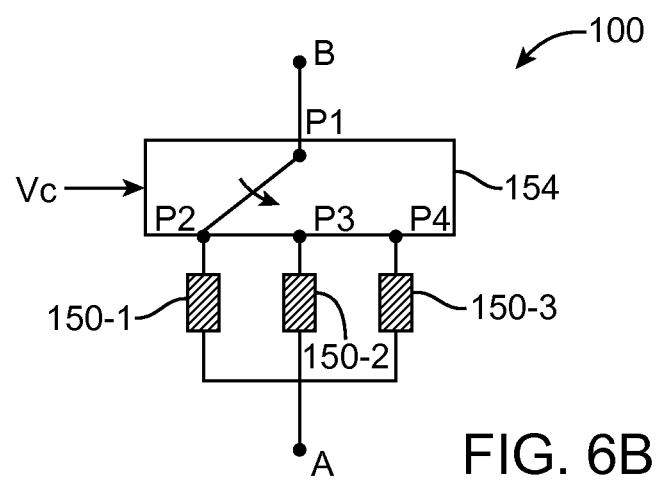

In another suitable arrangement, tunable element 100 may include a switch 154 (e.g., a single-pole triple-throw radio-frequency switch) and multiple load circuits 150-1, 150-2, and 150-3. As shown in FIG. 6B, switch 154 may have ports P1, P2, P3, and P4. Terminal B of tunable element 100 may be coupled to port P1 while terminal A of tunable element 100 may be coupled to port P2 via circuit 150-1, to port P3 via circuit 150-2, and to port P4 via circuit 150-3. As described previously, load circuits 150-1, 150-2, and 150-3 may include any desired combination of resistive components, inductive components, and capacitive components formed using integrated circuits, discrete components, or other suitable conductive structures. Switch 154 may be controlled using signal Vc generated by control circuit 102. For example, switch 154 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 6B in which tunable element 100 includes three impedance loading circuits is merely illustrative and does not serve to limit the scope of the present invention. If desired, tunable element 100 may include a radio-frequency switch having any number of ports configured to support switching among any desired number of loading circuits. If desired, switch 154 may be configured such that more than one of the multiple loading circuits 150 is coupled to port P1 in parallel.

Figure 6C:
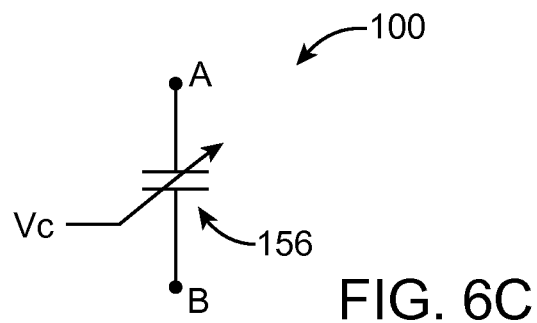
FIG. 6C is a circuit diagram of an illustrative variable capacitor circuit that may be used as an antenna tuning element in accordance with an embodiment of the present invention.

In another suitable arrangement, tunable element 100 may include a variable capacitor circuit 156 (sometimes referred to as a varactor). As shown in FIG. 6C, varactor may have first terminal A, second terminal B, and a control terminal operable to receive signal Vc from control circuit 300. Control circuit 102 may be adjusted so that Vc adjusts the capacitance of varactor 156 to the desired amount. Varactor 156 may be formed using integrated circuits, one or more discrete components (e.g., SMT components), etc. In general, varactor 156 may be continuously variable capacitors or semi-continuously adjustable capacitors.

The use of an antenna tuning element 100 as part of antenna 40 introduces an additional component that needs to be characterized, because the design of antenna tuning element 100 can substantially impact the antenna performance of device 10. It may therefore be desirable to have a way of characterizing the performance of antenna tuning element 100 to determine its behavior when assembled within device 10. One way of testing the performance of antenna tuning element 100 involves mounting antenna tuning element 100 within an actual "form-factor" device 10 so that antenna tuning element 100 is placed in its true application environment (e.g., antenna tuning element 100 is placed in its intended assembled state, enabling element 100 to be presented with actual loading and operating conditions).

In accordance with an embodiment, another way of testing the performance of antenna tuning element 100 involves testing antenna tuning element 100 without actually mounting antenna tuning element 100 within a form-factor device 10. Testing antenna tuning element 100 without having to assemble element 100 in a form-factor device increases testing efficiency by preventing scenarios in which antenna 40 fails performance criteria due to a faulty antenna tuning element 100 and simplifies testing/debugging of the antenna system.

Conventional test systems are configured to test electronic components in a 50 ohm environment (i.e., a typical test system presents a 50 ohm impedance to the electronic components under test). The radio-frequency (RF) performance of most electronic components may, however, vary with the RF voltage and current stress on the electronic components. As a result, it may be desirable to test electronic components (e.g., antenna tuning elements, conductive antenna structures, and other components that affect antenna system performance) while presenting the electronic components with radio-frequency voltage/current stress levels that the electronic components would be experiencing when assembled within a form-factor device.

Conventional test systems, however, are not optimized to present desired voltage/current levels to the components under test, and as a result, consume excessive amounts of power. It may therefore be desirable to provide a test system optimized for testing electronic devices such as antenna tuning elements 100 and other radio-frequency electronic devices under test (DUTs) in an "in-situ" application environment (i.e., a test system suitable optimized for applying a predetermined amount of RF voltage/current stress to the DUTs with reduced power consumption) without having to assemble the DUTs in a form-factor device.

Figure 7:
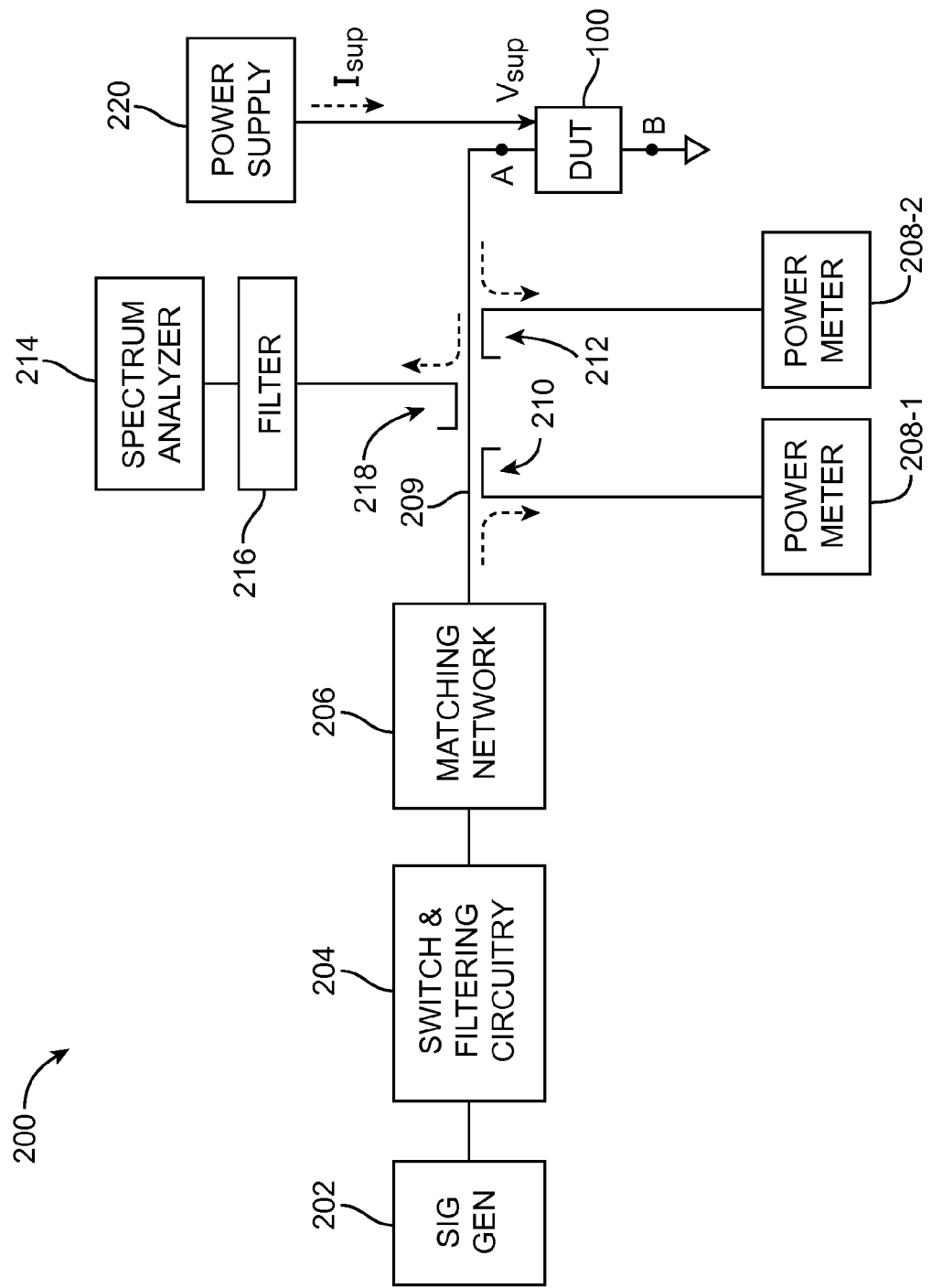
FIG. 7 is a diagram of an illustrative test system for use in applying desired radio-frequency (RF) voltage/current stress to an antenna tuning element coupled in a shunt configuration in accordance with an embodiment of the present invention.

FIG. 7 is a diagram showing one suitable arrangement of a test system such as radio-frequency test system 200 suitable for testing antenna tuning element 100 in a shunt configuration. The example of FIG. 7 in which test system 200 is used to test an antenna tuning element is merely illustrative and does not serve to limit the scope of the present invention. In general, test system 200 may be used to test any unassembled and/or assembled portion of a wireless electronic device 10.

As shown in FIG. 7, test system 200 may include a signal generator 202, switch and filtering circuitry 204, matching network circuitry 206, a first power meter 208-1, a second power meter 208-2, an RF test unit such as a spectrum analyzer 214 and associated filter circuitry 216, and a power supply unit 220. Signal generator 202 may be used to generate radio-frequency test signals at desired fundamental frequencies (e.g., frequencies in cellular bands at which device 10 may operate during normal wireless transmission). These test signals may be provided to DUT 100 via a coaxial cable, radio-frequency transmission line path, and/or other suitable conductive paths.

Signal generator 202 may be operated directly or via computer control (e.g., when signal generator 202 receives commands from a test host). When operated directly, a user may control signal generator 202 by supplying commands directly to the signal generator using a user input interface of signal generator 202. For example, a user may press buttons in a control panel on the signal generator while viewing information that is displayed on a display in generator 202. In computer controlled configurations, a test host (e.g., software running autonomously or semi-autonomously on a personal computer) may communicate with signal generator 202 (e.g., by sending and receiving data over a wired path or a wireless path between the computer and the signal generator).

The test signals output from signal generator 202 may be fed to switch and filtering circuitry 204. Circuitry 204 may serve to filter out signals in unwanted frequency bands and to pass signals in desired frequency bands. Matching network 206 may be interposed in the signal path between signal generator 202 and DUT 100 (e.g., matching network 206 may have a first terminal that is coupled to circuitry 24 and a second terminal that is coupled to DUT 100 via path 209).

Matching network 206 may be optimized to present to DUT 100 the desired amount of RF voltage/current stress in a selected frequency band while minimizing the source power of signal generator 202. In other words, matching network 206 may be configured to apply a predetermined amount of RF stress to the device under test in the selected frequency band while stress levels at frequencies outside the selected frequency band are at most equal to the predetermined amount of RF stress (e.g., so that signal generator 202 does not expend unnecessary amounts of energy outside the frequency band of interest). The voltage and current stress levels may be specified in terms of a voltage or current magnitude that is applied to the single-ended terminal of DUT 100 and that places DUT 100 in an elevated stress level. Testing DUT 100 in an elevated stress environment may help characterize the reliability of the DUT in the antenna system at edge scenarios.

Power meter 208-1 may be coupled to path 209 via broadband radio-frequency coupler 210. Coupler 210 may be used to divert a small fraction of the transmitted radio-frequency test signals that are being conveyed to DUT 100. As an example, coupler 210 may be a −20 dB coupler that is used to extract one percent of the delivered powered with which the signals are being transmitted to DUT 100. Power meter 208-2 may be coupled to path 209 via broadband radio-frequency coupler 212. Coupler 212 may be used to divert a small fraction of the signals that have been reflected back from DUT 100. Coupler 212 may also be a −20 dB coupler (as an example).

Power meters 208 (i.e., power meters 208-1 and 208-2) may include radio-frequency receiver circuitry that is able to gather information on the magnitude and phase of signals transmitted to and reflected from DUT 100 (i.e., radio-frequency signals that are reflected from DUT 100 or radio-frequency signals that have passed through at least a portion of DUT 100). By analyzing transmitted signals using power meter 208-1 and reflected signals using power meter 208-2, the magnitude and phase of the complex impedance (sometimes referred to as a reflection coefficient) of DUT 100 may be determined. For example, by analyzing the transmitted and reflected signals, power meters 208-1 and 208-1 may collectively be used to obtain linear measurements such as S-parameter measurements that reveal information about whether DUT 100 exhibits satisfactory radio-frequency performance. For example, S11 (complex impedance) measurements may be obtained and computed based on data gathered using power meters 208. The values of S11 can be measured at desired fundamental frequencies.

Spectrum analyzer 214 may be coupled to path 209 via broadband radio-frequency coupler 218. Coupler 218 may be used to divert a small fraction of the signals that have been reflected back from DUT 100 to spectrum analyzer 214. Coupler 218 may be a −20 dB coupler (as an example). Filter circuitry 216 may be interposed between coupler 218 and spectrum analyzer 214. Filter circuitry 216 may, for example, include band-pass filter circuitry for passing through signals at selected harmonic frequencies (i.e., frequencies that are integer multiples of the fundamental frequency associated with the test signal generated by signal generator 202). Configured in this way, spectrum analyzer 214 may be used to measure harmonic distortion generated by DUT 100. If desired, more than one signal generator 202 may be used for measuring intermodulation distortion.

In scenarios in which DUT 100 is an active device (i.e., a device that includes active components requiring power for operation), test system 200 may use power supply unit 220 to supply power to DUT 100. As shown in FIG. 7, power supply 220 may provide a positive power supply voltage Vsup to DUT 100. Power supply voltage Vsup may be used to power active switching circuitry in DUT 100 (as an example). During testing, power supply 220 may be used to monitor the amount of current Isup that is supplied to DUT 100 (e.g., to measure the amount of power consumed by DUT 100 during testing).

Figure 8:
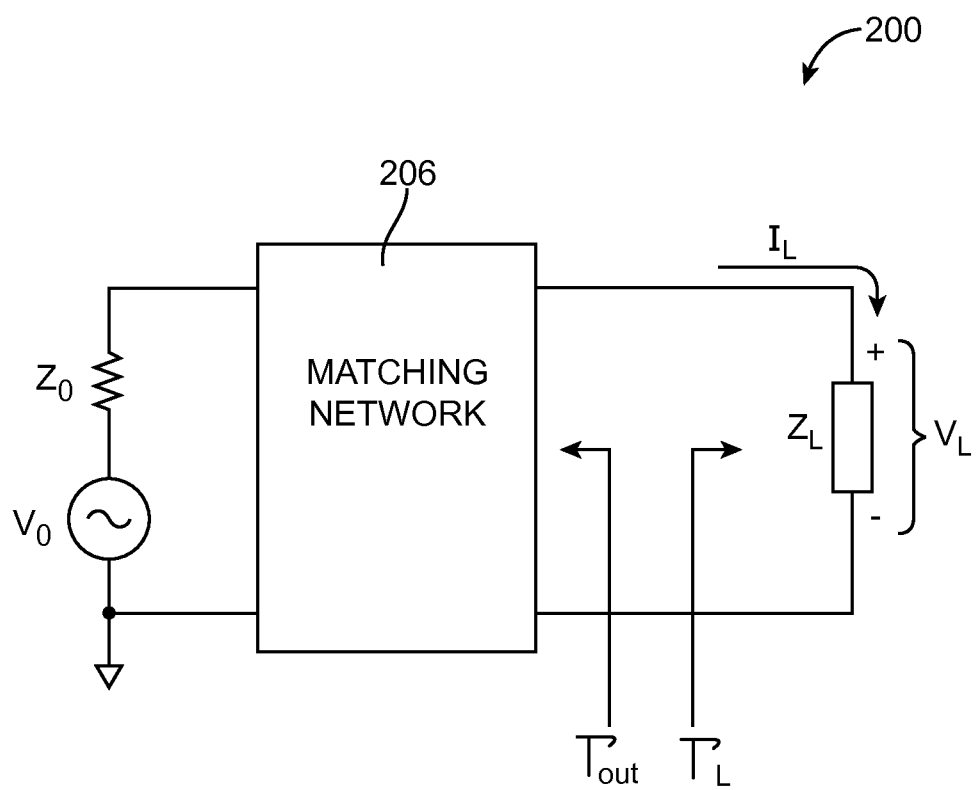
FIG. 8 is a diagram showing an equivalent circuit model of the test system of FIG. 7 in accordance with an embodiment of the present invention.

In order for test system 200 to apply the desired amount of stress to DUT 100 at reduce power levels, matching network 206 has to be optimized for maximum power transfer. FIG. 8 is a diagram of an equivalent circuit model of the test system of FIG. 7. As shown in FIG. 8, voltage source $V_O$ may represent the signal output by signal generator 202, impedance $Z_O$ may represent a source impedance (i.e., a value that represents the lumped impedance associated with circuitry coupled to the first terminal of matching network 206), and impedance $Z_L$ may represent the impedance associated with DUT 100.

Test system 200 may be configured to apply a predetermined RF voltage stress $V_L$ across the shunt DUT and to apply a predetermined RF current stress $I_L$ that flows through the shunt DUT. DUT impedance $Z_L$ may have an associated reflection coefficient $\Gamma_L$. In order to minimize the power consumption of signal generator 202 (sometimes referred to as source power), matching network 206 should be designed to provide conjugate matching at the DUT reference plane. In other words, matching network 206 should exhibit a reflection coefficient Γout at its second terminal that is equal to the conjugate of $\Gamma_L$ (e.g., Γout is equal to $\Gamma_L^*$).

Figure 9:
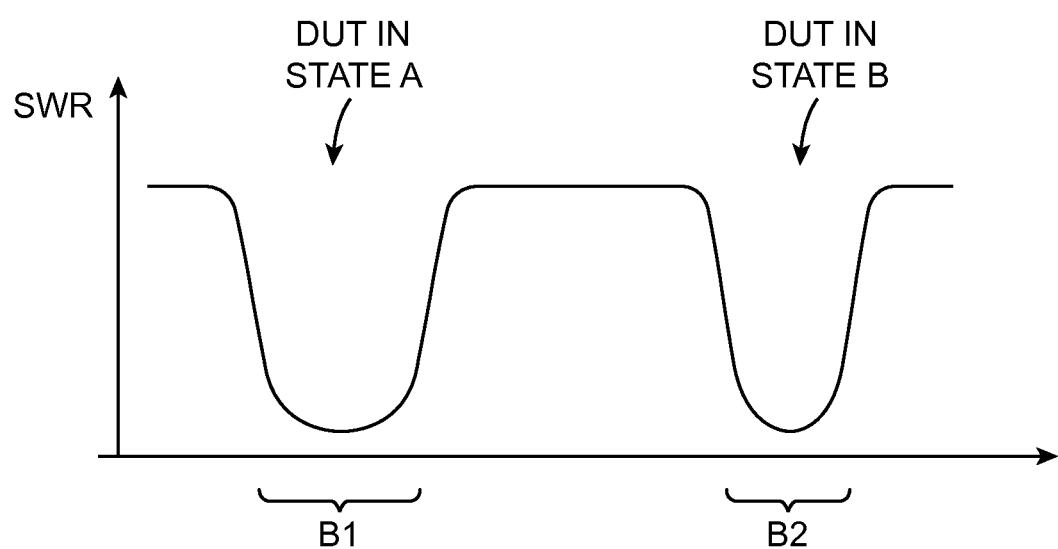
FIG. 9 is a plot showing how antenna tuning elements may be placed in different states to cover multiple communications bands of interest in accordance with an embodiment of the present invention.

FIG. 9 is an illustrative SWR plot showing how device 10 may exhibit a first resonant peak at a first RF communications band B1 when DUT 100 is placed in a first state A and a second resonant peak at a second RF communications band B2 when DUT 100 is placed in a second state B that is different than state A. Band B1 may refer to cellular communications frequencies ranging from 700 MHz to 960 MHz, whereas band B2 may refer to cellular communications frequencies ranging from 1710 MHz to 2170 MHz (as an example). Other bands of interest may include a band centered around the 1575 MHz GPS communications band, a band covering cellular communications frequencies ranging from 2300 MHz to 2690 MHz), etc. In general, DUT 100 may be placed in one or more different states when being used to help device 10 cover two or more RF communications bands of interest.

In certain embodiments, DUT 100 may be a radio-frequency switch that can be placed in an on (closed) state or an off (opened) state. As an example, it may be desirable to test DUT 100 in the closed state in band B1 and to test DUT 100 in the opened state in band B2 if these configurations represent the actual operating states of element 100 during normal operation of device 10. As another example, it may be desirable to test DUT 100 in the opened state in band B1 and to test DUT 100 in the closed state in band B2. As yet another example, it may be desirable to test DUT 100 in the opened state in both bands B1 and B2. As yet another example, it may be desirable to test DUT 100 in the closed state in both bands B1 and B2.

In general, either a desired RF voltage stress level or a desired RF current stress level is specified at any given frequency band of interest. The type of RF stress that is specified (i.e., whether a predetermined RF voltage stress requirement or a predetermined RF current stress requirement is specified) at each frequency band may depend on the operating state of DUT 100 in that frequency band. In the first example above in which DUT 100 is an RF switch, a voltage stress condition may be specified for when DUT 100 is placed in the opened state since minimal current flows through an opened switch, whereas a current stress condition may be specified for when DUT 100 is placed in the closed state since the voltage drop across a closed switch is minimal.

Figure 10:
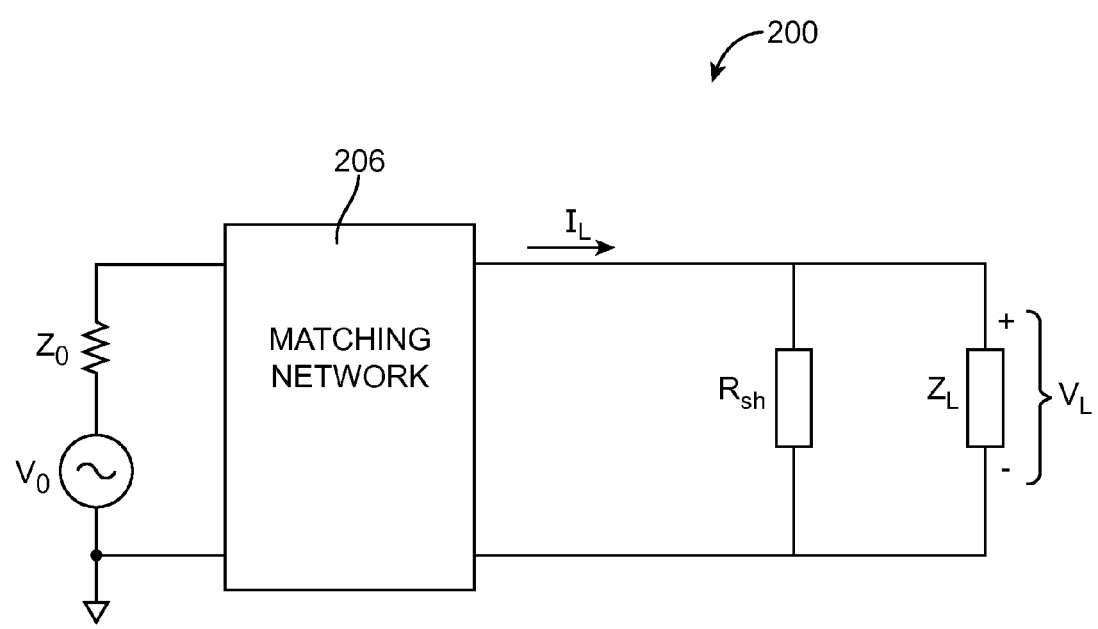
FIG. 10 is a diagram of an illustrative test system that includes a shunt resistive element coupled in parallel with the antenna tuning element under test in accordance with an embodiment of the present invention.

When DUT 100 is placed in the opened state (i.e., when RF switch 100 is turned off), the impedance $Z_L$ of DUT 100 may be high and may be difficult to match at high frequencies. FIG. 10 shows another suitable arrangement of test system 200 that includes a test shunt resistor Rsh coupled in parallel with DUT 100. The resistance of shunt resistor Rsh may be substantially less than the input impedance of DUT 100 in the opened state. For example, shunt resistor Rsh may have a resistance value that is equal to 1000 ohms. The use of the shunt resistor reduces the effective resistance as seen by matching network 206 at its second terminal, thereby simplifying the design of matching network 206. As a result, most of the source power is dissipated through the shunt resistor when DUT 100 is in the off state.

When DUT 100 is placed in the closed state (i.e., when RF switch 100 is turned on), the impedance $Z_L$ of DUT 100 may be substantially less than the resistance of Rsh. Shunt resistor Rsh need not be included for test scenarios in which DUT 100 exhibits low impedance but is left in to keep test setup consistent (since most of the current $I_L$ flows through DUT 100). As a result, most of the source power is dissipated in DUT 100 when DUT 100 is in the on state.

Figure 11:
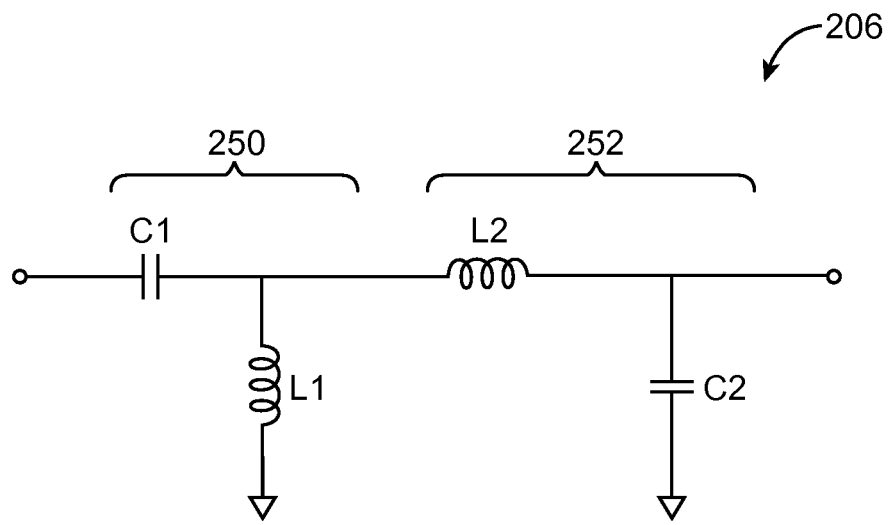
FIGS. 11 and 12 are circuit diagrams of illustrative dual-band matching network circuitry in accordance with an embodiment of the present invention.

FIG. 11 is a circuit diagram showing one suitable arrangement of matching network 206. As shown in FIG. 11, matching network 206 may include a first matching circuit 250 that is connected to the first terminal of matching network 206 and a second matching circuit 252 that is connected to the second terminal of matching network 206. Matching circuit 250 may include a series capacitor C1 and a shunt inductor L1, whereas matching circuit 252 may include a series inductor L2 and a shunt capacitor C2.

Figure 12:
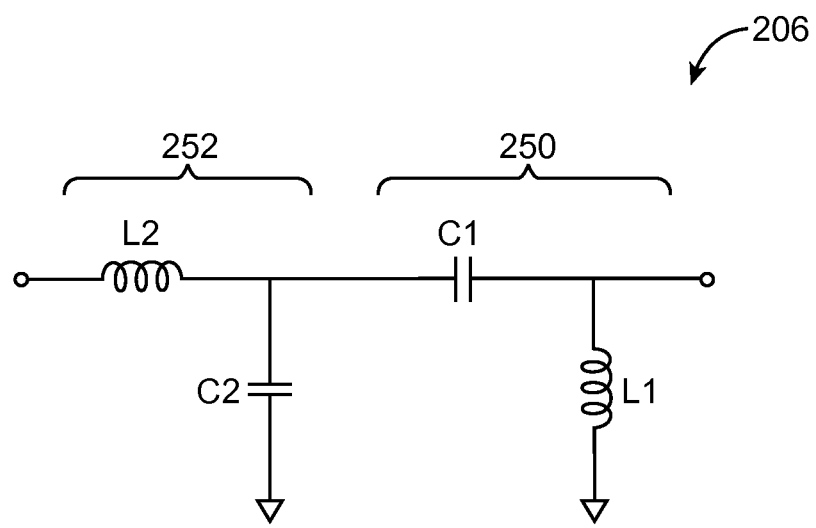

In the example of FIG. 11, matching circuit 250 may be suitable for providing matching with DUT 100 in the opened state (e.g., matching circuit 250 may be used to provide desired RF voltage stress) at a first RF communications band. Matching circuit 252 may be suitable for providing matching with DUT 100 in the closed state (e.g., matching circuit 252 may be used to provide desired RF current stress) at a second RF communications band. Matching circuits 250 and 252 may be cascaded to provide dual-band matching (e.g., so that the desired voltage stress can be applied to DUT 100 at the first RF band and so that the desired current stress can be applied to DUT 100 at the second RF band) while minimizing source power. If desired, matching network 206 may be cascaded in any order (see, e.g., FIG. 12).

FIG. 13 is a table illustrating five possible test scenarios that can be applied to DUT 100 at two different RF bands of interest. Matching circuits that may be used include $M_{V1}$ (e.g., a matching circuit optimized to provide a predetermined voltage stress level to DUT 100 in band 1), $M_{V2}$ (e.g., a matching circuit optimized to provide a predetermined voltage stress level to DUT 100 in band 2), $M_{I1}$ (e.g., a matching circuit optimized to provide a predetermined current stress level to DUT 100 in band 1), $M_{I2}$ (e.g., a matching circuit optimized to provide a predetermined current stress level to DUT 100 in band 2), $M_{VI1}$ (e.g., a matching circuit optimized to provide predetermined voltage stress and current stress levels to DUT 100 in band 1), and $M_{VI2}$ (e.g., a matching circuit optimized to provide predetermined voltage stress and current stress levels to DUT 100 in band 2). A matching circuit that is optimized for a given frequency band will yield the desired predetermined stress level in the given frequency band while applying relatively lower stress levels in other frequency bands outside the given frequency band. Circuit 250 shows one suitable implementation of $M_{V1}$, whereas circuit 252 shows one suitable implementation of $M_{I2}$ (see, e.g., FIGS. 11 and 12).

Referring back to FIG. 13, it may be desirable to apply RF voltage stress to DUT 100 in both band 1 and band 2 in a first test scenario. The desired voltage stress level in band 1 may or may not be the same as that of band 2. In this first scenario, matching network 206 may include matching circuits $M_{V1}$ and $M_{V2}$ cascaded in any order.

In a second test scenario, it may be desirable to apply RF current stress to DUT 100 in both band 1 and band 2. The desired current stress level in band 1 may or may not be the same as that of band 2. In this second scenario, matching network 206 may include matching circuits $M_{I1}$ and $M_{I2}$ cascaded in any order.

In a third test scenario, it may be desirable to apply voltage stress to DUT 100 in band 1 and to apply current stress to DUT 100 in band 2. In this third scenario, matching network 206 may include matching circuits $M_{V1}$ and $M_{I2}$ cascaded in any order.

In a fourth test scenario, it may be desirable to apply current stress to DUT 100 in band 1 and to apply voltage stress to DUT 100 in band 2. In this fourth scenario, matching network 206 may include matching circuits $M_{I1}$ and $M_{V2}$ cascaded in any order.

In a fifth test scenario, it may be desirable to apply voltage and current stress to DUT 100 in band 1 and to apply voltage and current stress to DUT 100 in band 2. The specified voltage stress in band 1 may or may not be the same as the voltage stress specified in band 2. Similarly, the specified current stress in band 1 may or may not be the same as the current stress specified in band 2. In this fifth scenario, matching network 206 may include matching circuits $M_{VI1}$ and $M_{VI2}$ cascaded in any order.

The five test scenarios in FIG. 13 are merely illustrative and do not serve to limit the scope of the present invention. In general, matching network 206 may include any number of matching circuits optimized to provide the desired RF voltage and/or current stress in two or more RF communications band of interest. Matching network 206 may be implemented using cascaded matching circuits, filter circuits, or other suitable passive components.

Figure 14:
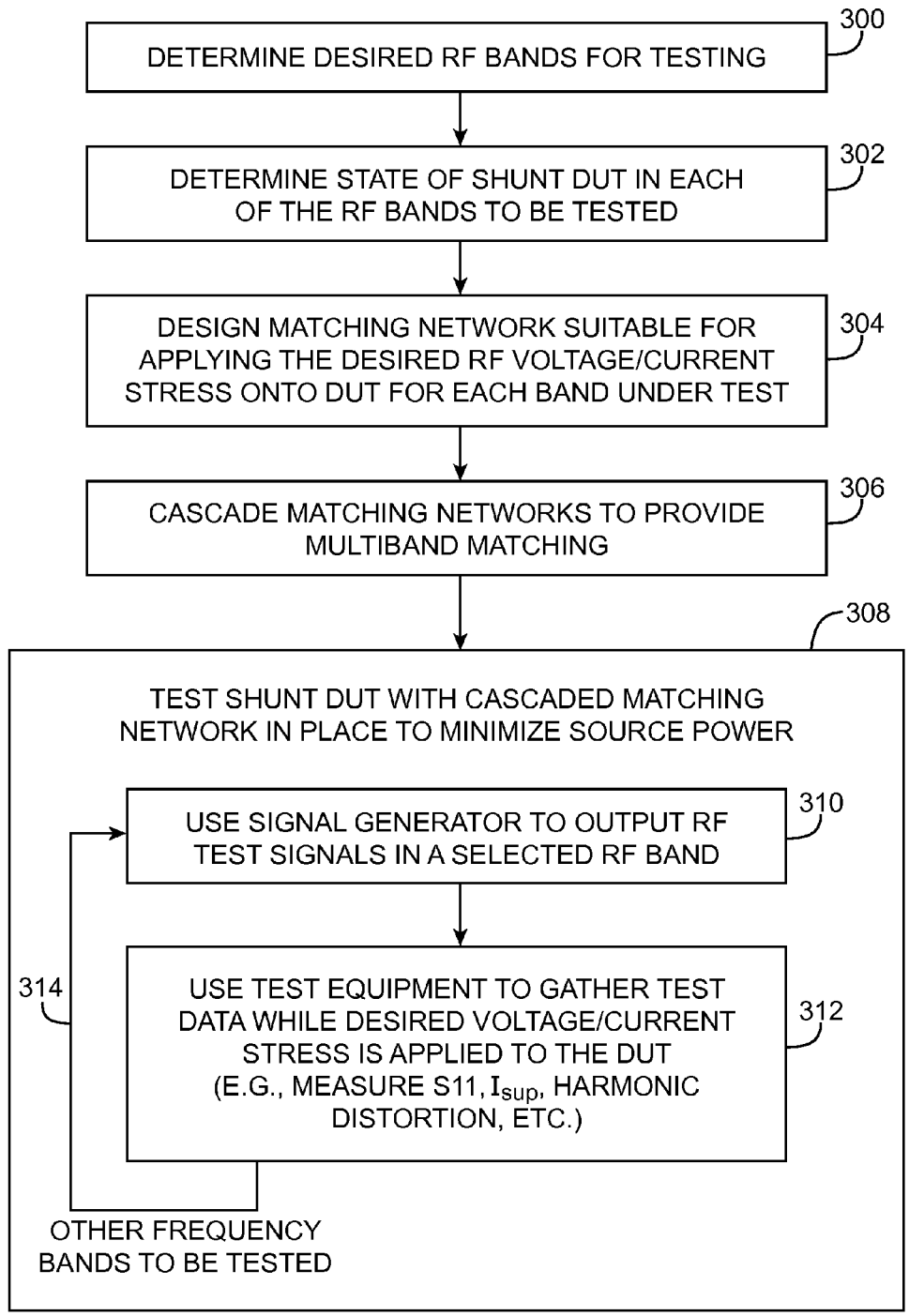
FIG. 14 is a flow chart of illustrative steps for designing and using a test system of the type shown in FIG. 7 to test a shunt electronic component in multiple communications bands in accordance with an embodiment of the present invention.

FIG. 14 is a flow chart of illustrative steps involved in designing and using a test system of the type shown in FIG. 7 to test a shunt DUT 100 in multiple communications bands. At step 300, the desired RF communications bands of interest may be identified. At step 302, the desired operating state of DUT 100 in each of the bands may be determined (e.g., the actual in-situ operating state of element 100 during normal operation of device 10 in the different bands may be identified).

At step 304, matching circuits optimized for applying the desired RF voltage and/or current stress to DUT 100 in each of the bands of interest may be designed (e.g., the design for matching circuits $M_{V1}$, $M_{V2}$, $M_{I1}$, and $M_{I2}$ may be optimized for maximum power transfer while providing the desired voltage/current stress). The desired stress levels may correspond to stress levels that antenna tuning element 100 would actually experience when assembled within device 10 during normal wireless operation. At step 306, the matching circuits obtained during step 304 may be cascaded to form matching network 206, which is used to provide matching in the multiple communications bands of interest.

At step 308, test system 200 that includes matching network 206 may be used to characterize shunt DUT 100. Test system 200 configured in this way may be used to present the desired current/voltage stress onto DUT 100 while consuming minimal source power. In particular, signal generator 202 may be configured to output RF test signals in a selected RF band (at step 310). At step 312, test system 200 may be used to gather test data while the desired voltage/current stress is applied to DUT 100. For example, power meters 208 may be used to measure S-parameters, spectrum analyzer 214 may be used to measure harmonic distortion, and power supply 220 may be used to measure power consumed by DUT 100. Processing may loop back to step 310 to test the performance of DUT 100 at the other RF bands of interested (as indicated by path 314).

Figure 15:
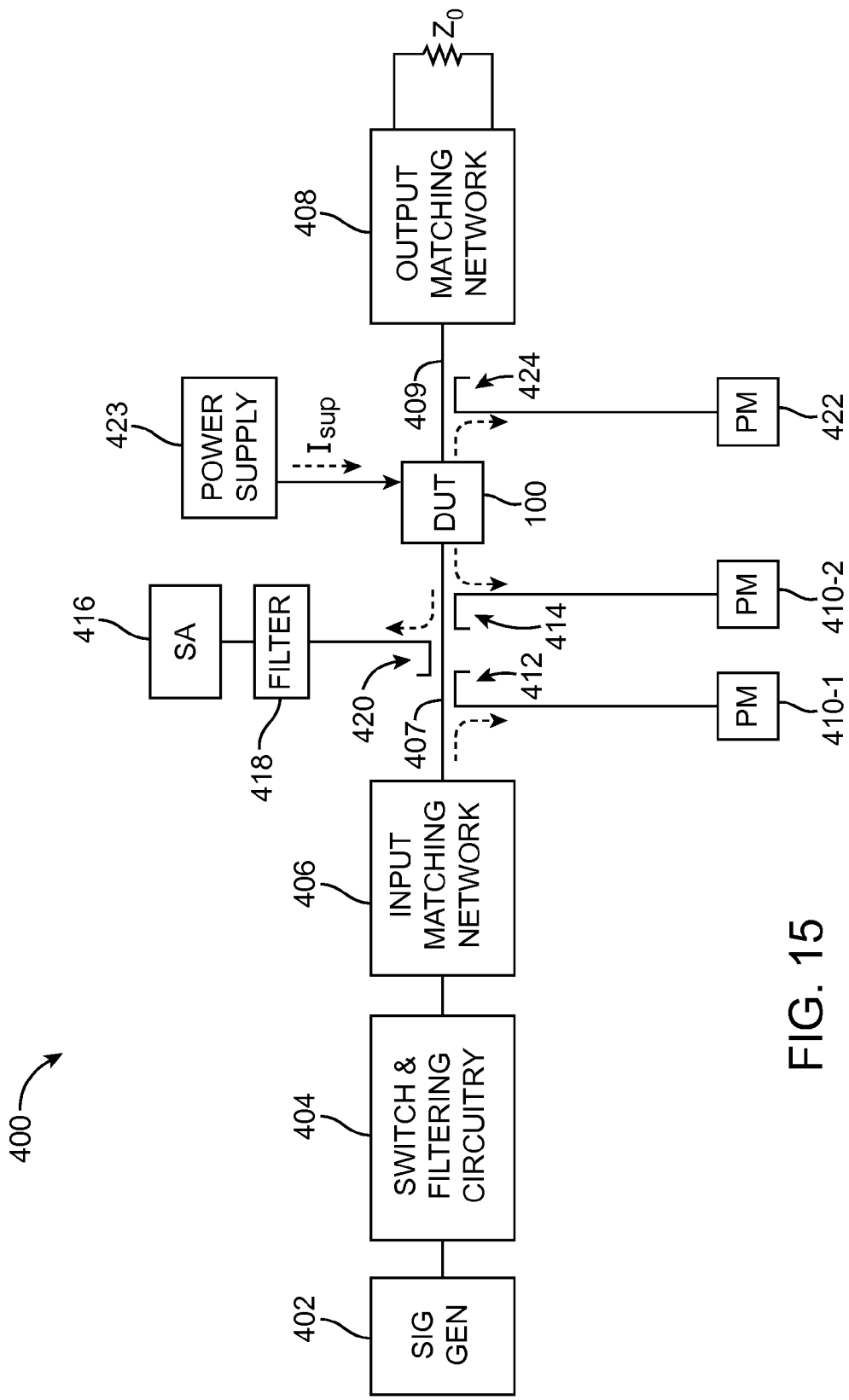
FIG. 15 is a diagram of an illustrative test system configured to apply desired radio-frequency voltage/current stress to an antenna tuning element coupled in a series configuration in accordance with an embodiment of the present invention.

Antenna tuning element 100 may be assembled within device 10 in a shunt or a series configuration. FIG. 15 is a diagram showing another suitable arrangement of a test system such as radio-frequency test system 400 suitable for testing antenna tuning element 100 in a series configuration. The example of FIG. 15 in which test system 400 is used to test an antenna tuning element is merely illustrative and does not serve to limit the scope of the present invention. In general, test system 400 may be configured to test any unassembled and/or assembled portion of a wireless electronic device 10.

As shown in FIG. 15, test system 400 may include a signal generator 402, switch and filtering circuitry 404, input matching network circuitry 406, output matching network circuitry 408, a first power meter 410-1, a second power meter 410-2, a third power meter 422, an RF test unit such as a spectrum analyzer 416 and associated filter circuitry 418, and a power supply 423. Signal generator 402 may be used to generate radio-frequency test signals at desired fundamental frequencies (e.g., frequencies at which device 10 may operate during normal wireless transmission). These test signals may be provided to DUT 100 via a coaxial cable, radio-frequency transmission line path, and/or other suitable conductive paths.

The test signals output from signal generator 402 may be fed to switch and filtering circuitry 404. Circuitry 404 may serve to filter out signals in unwanted frequency bands and to pass signals in desired frequency bands (i.e., at the fundamental frequencies). Input matching network 406 may have a first terminal that receives test signals from circuitry 404 and a second terminal that is coupled to DUT 100 via path 407. Output matching network 408 may have a first terminal that is coupled to DUT 100 via path 309 and a second terminal that is coupled to a terminal load $Z_0$ (e.g., a 50 ohm load).

Matching network 406 may be optimized to present the desired amount of RF voltage/current stress at the "input" of DUT 100 at a given frequency, whereas matching network 408 may be optimized to present the desired amount of RF voltage/current stress at the "output" of DUT 100 at the given frequency (e.g., a first terminal of series DUT 100 is sometimes referred to as the input terminal, whereas the second terminal of series DUT 100 is sometimes referred to as the output terminal). In other words, input matching network 406 may be configured to present a first predetermined amount of RF stress at the given frequency to the input of DUT 100 while keeping stress levels at all other frequencies less than or equal to the first predetermined amount of RF stress, whereas output matching network 408 may be configured to present a second predetermined amount of RF stress at the given frequency to the output of DUT 100 while keeping stress levels at all other frequencies at most equal to the second predetermined amount of RF stress.

Power meter 410-1 may be coupled to path 407 via broadband radio-frequency coupler 412. Coupler 412 may be used to divert a small fraction of the transmitted radio-frequency test signals that are being conveyed to DUT 100. Power meter 410-2 may be coupled to path 407 via broadband radio-frequency coupler 414. Coupler 414 may be used to divert a small fraction of the signals that have been reflected back from the input of DUT 100. Power meter 422 may be coupled to path 409 via broadband radio-frequency coupler 424. Coupler 424 may be used to divert a small fraction of the signals presents at the output of DUT 100.

Power meters 410 (i.e., power meters 410-1 and 410-2) may include radio-frequency receiver circuitry that is able to gather information on the magnitude and phase of signals transmitted to and reflected from DUT 100 (i.e., radio-frequency signals that are reflected from DUT 100 or radio-frequency signals that have passed through at least a portion of DUT 100). Power meter 422 may include radio-frequency receiver circuitry that is able to gather information on the magnitude and phase of signals that is transferred from the input terminal to the output terminal of DUT 100. Complex reflection coefficient (e.g., S11) measurements may be obtained based on test data gathered using power meters 410-1 and 410-2, whereas complex forward transfer coefficient (e.g., S21) measurements may be obtained based on data test gathered using power meters 410-1 and 422. The values of S11 and S21 may be measured at desired fundamental frequencies.

Spectrum analyzer 416 may be coupled to path 407 via broadband radio-frequency coupler 420. Coupler 420 may be used to divert a small fraction of the signals that have been reflected back from DUT 100 to spectrum analyzer 416. Filter circuitry 418 may be interposed between coupler 420 and spectrum analyzer 416. Filter circuitry 418 may, for example, include band-pass filter circuitry for passing through signals at selected harmonic frequencies (i.e., frequencies that are integer multiples of the fundamental frequency associated with the test signal generated by signal generator 402). Configured in this way, spectrum analyzer 214 may be used to measure harmonic distortion generated by DUT 100. If desired, more than one signal generator 402 may be used for measuring intermodulation distortion.

In scenarios in which DUT 100 is an active device (i.e., a device that includes active components requiring power for operation), test system 400 may include power supply unit 423 that supplies power to DUT 100. As shown in FIG. 15, power supply 423 may provide a positive power supply voltage Vsup to DUT 100. During testing, power supply 423 may be used to monitor the amount of current Isup that is supplied to DUT 100.

Figure 16:
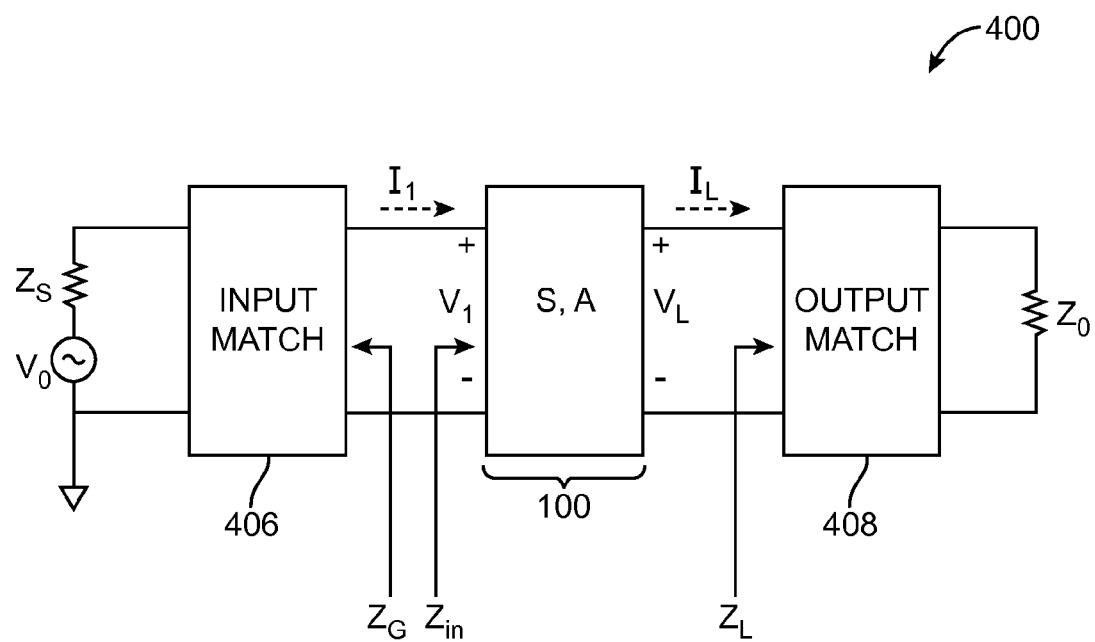
FIG. 16 is a diagram showing an equivalent circuit model of the test system of FIG. 15 in accordance with an embodiment of the present invention.

In order for test system 400 to apply the desired amount of stress at both terminals of DUT 100 with reduced power, matching networks 406 and 408 have to be optimized for maximum power transfer. FIG. 16 is a diagram of an equivalent circuit model of the test system as shown in FIG. 15. As shown in FIG. 16, voltage source $V_0$ may represent the signal output using signal generator 402, impedance Zs may represent a source impedance (i.e., a value that represents the lumped impedance associated with circuitry coupled to the first terminal of matching network 406), and impedance $Z_0$ may represent a terminal load impedance of 50 ohms (as an example). The two-port behavior of DUT 100 may be represented by scattering parameter (sometimes referred to as S-parameter) and ABCD parameter (sometimes referred to as chain, cascade, or transmission line parameter) information that is known prior to testing. For example, the S-parameters and the ABCD-parameters may be obtained from the manufacturer of DUT 100 or may be measured using vector network analyzers prior to being tested with system 400.

Test system 400 may be configured to apply predetermined RF voltage stress $V_1$ and/or current stress $I_1$ at the input of series DUT 100 and to apply predetermined RF voltage stress $V_L$ and/or current stress $I_L$ at the output of series DUT 100. DUT 100 may exhibit an input impedance Zin. Input matching network 406 may present an impedance $Z_G$ to the input of DUT 100, whereas output matching network 408 may present a load impedance $Z_L$ to the output of DUT 100. In order to minimize the source power of signal generator 402, input matching network 406 should be designed to provide conjugate matching at the DUT reference plane. In other words, input matching network 406 should exhibit impedance $Z_G$ that is equal to the conjugate of Zin (e.g., Zin is equal to $Z_G^*$).

As described above, the behavior of DUT 100 may be characterized by S-parameters S11, S12, S21, and S22. Corresponding ABCD parameters may be obtained based on the following equations:

$$a = \frac{(1+S_{11})(1-S_{22}) + S_{12}S_{21}}{2S_{21}} \quad (1)$$

$$b = \frac{(1+S_{11})(1+S_{22}) - S_{12}S_{21}}{2S_{21}} z_0 \quad (2)$$

$$c = \frac{(1-S_{11})(1-S_{22}) - S_{12}S_{21}}{2S_{21}} / z_0 \quad (3)$$

$$d = \frac{(1-S_{11})(1+S_{22}) + S_{12}S_{21}}{2S_{21}} \quad (4)$$

Figure 17:
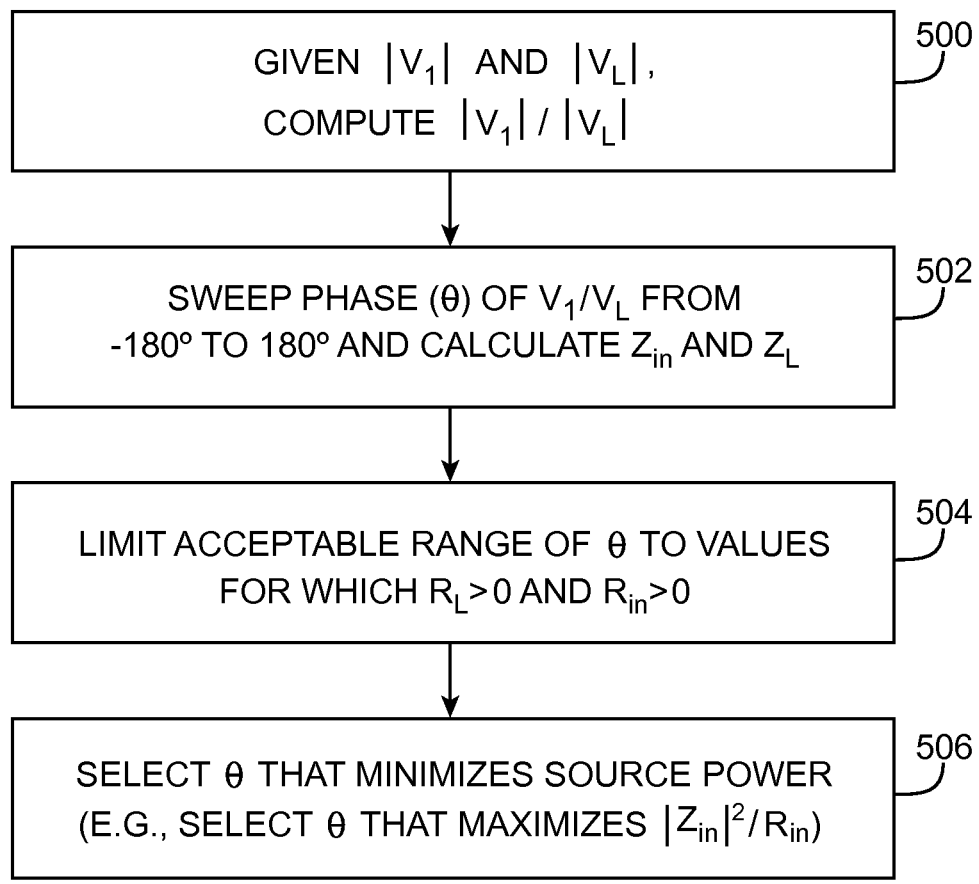
FIG. 17 is a flow chart of illustrative steps involved in designing input-output matching network circuitry suitable for applying predetermined input and output RF voltage stress levels to an antenna tuning element in accordance with an embodiment of the present invention.

Depending on the current state of DUT 100, it may be desirable to specify either the desired voltage or current stress at the input and output of DUT 100 in the series configuration. In one suitable embodiment, the magnitude of the voltage stress at the input and output of DUT 100 are specified. FIG. 17 is a flow chart of illustrative steps involved in designing the input and output matching networks optimized for providing desired voltage stress at the input and output of DUT 100 with minimal source power.

At step 500, a given input voltage stress magnitude $|V_1|$ and output voltage stress magnitude $|V_L|$ may be specified. When $|V_1|$ and $|V_L|$ are specified, the voltage stress ratio $|V_1|:|V_L|$ can be computed. From this ratio, a corresponding phase offset θ and output matching impedance $Z_L$ can be calculated using the following equations:

$$\frac{V_1}{V_L} = \left|\frac{V_1}{V_L}\right| e^{j\theta} \quad (5)$$

$$Z_L = \frac{b}{\frac{V_1}{V_L} - a} \quad (6)$$

$$Z_{in} = \frac{aZ_L + b}{cZ_L + d} \quad (7)$$

where phase θ is equal to the phase difference between the RF input voltage stress and the RF output voltage stress, and wherein a, b, c, and d are computed using equations 1-4. At step 502, phase θ may be swept from −180° to 180° while computing $Z_L$ and Zin using equations 6 and 7, respectively. At step 504, the acceptable range of phase θ may be limited to values for which Rin (i.e., the real part of Zin) and $R_L$ (i.e., the real part of $Z_L$) are positive.

Assuming the conjugate matching condition which sets Zin equal to $Z_G^*$, the available source power Pavs can be expressed in terms of input voltage stress as follows:

$$P_{avs} = \frac{|V_1|^2}{2\frac{|z_{in}|^2}{R_{in}}} \quad (8)$$

In order to reduce source power, a phase θ should be selected that minimizes Pavs (e.g., θ is selected that maximizes the denominator of equation 8), as indicated in step 506.

Figure 18:
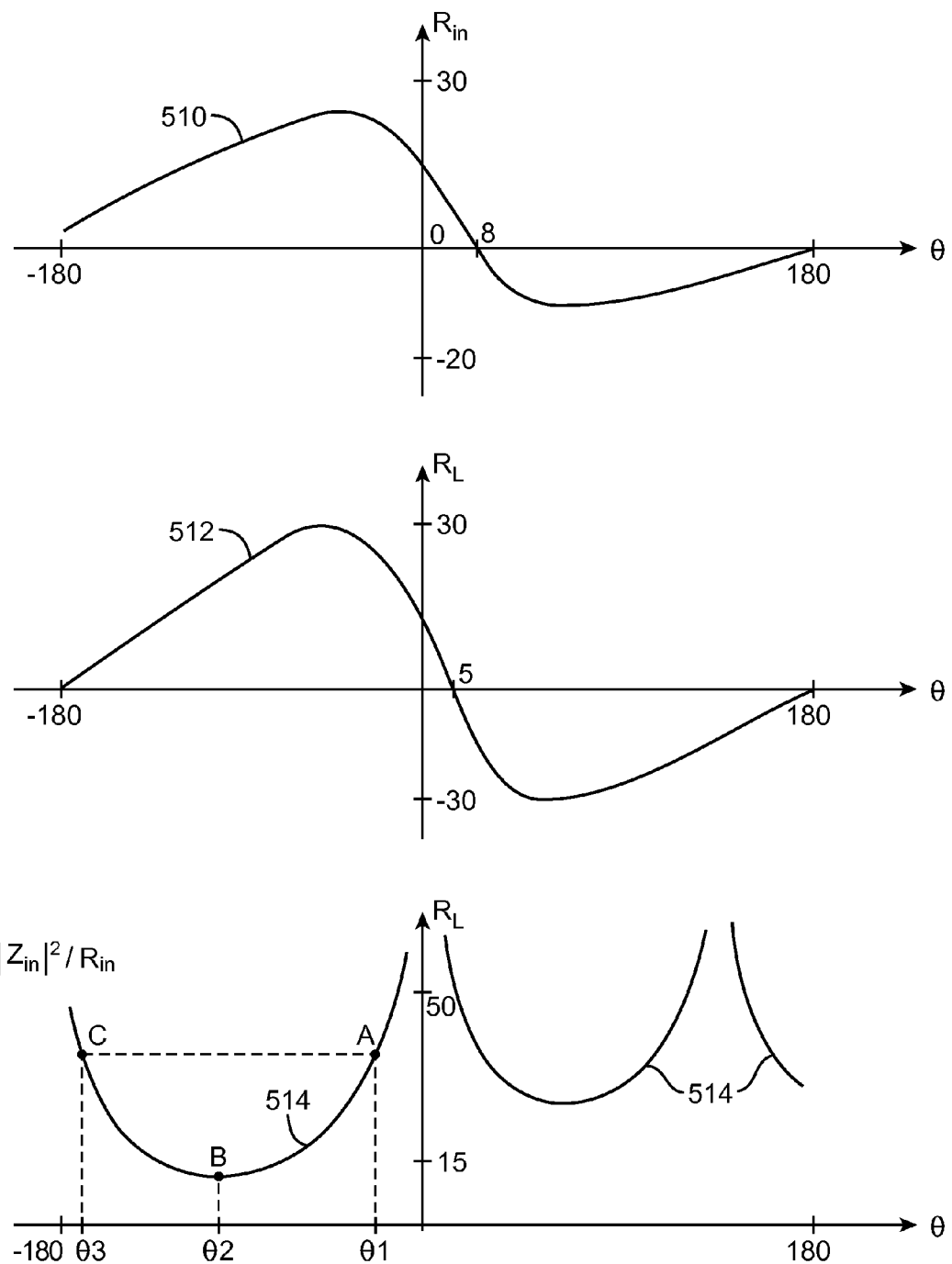
FIG. 18 shows plots illustrating how selection of input-output RF voltage phase offset affects source power in accordance with an embodiment of the present invention.

FIG. 18 shows plots of Rin, $R_L$, and the denominator of equation 8 as a function of input-output voltage stress ratio phase θ. In particular, curve 510 represents the magnitude of Rin as a function of θ; curve 512 represents the magnitude of $R_L$ as a function of θ; and curve 514 represents the magnitude of the denominator of equation 8 (e.g., $|Zin|^2/Rin$) as a function of θ. According to curve 510, Rin is only positive for θ less than eight degrees. According to curve 512, $R_L$ is only positive for θ less than five degrees. Acceptable values for θ are therefore limited to an overlapping region (e.g., θ should be between −180° and 5'). Within this acceptable range, various values of θ can be selected.

In the example of FIG. 18, a phase of θ1 corresponding to point A on curve 514 may yield a Pavs that is less than that yielded by a phase of θ2 corresponding to point B on curve 514 (since point A is greater than point B). A phase of θ3 corresponding to point C on curve 514 may also be chosen which yields the same reduced Pavs as θ1, but the corresponding current stress at the two phases would be different. Ideally, θ should be chosen so as to yield the maximum corresponding value on curve 514 while providing satisfactory current stress levels. Once phase θ has been selected, the input and output matching networks can then be designed.

Figure 19:
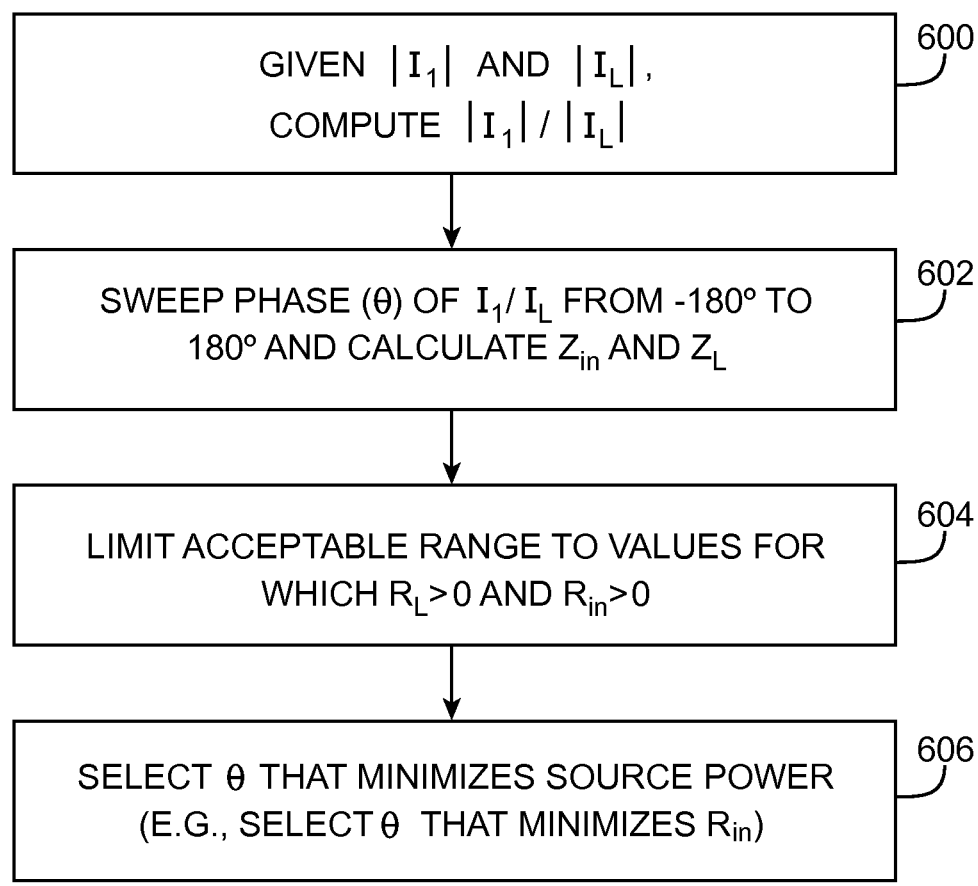
FIG. 19 is a flow chart of illustrative steps involved in designing input-output matching network circuitry suitable for applying predetermined input and output RF current stress levels to an antenna tuning element in accordance with an embodiment of the present invention.

In another suitable embodiment, the magnitude of the current stress at the input and output of DUT 100 can be specified. FIG. 19 is a flow chart of illustrative steps involved in designing the input and output matching networks optimized for providing desired current stress at the input and output of DUT 100 with minimal source power.

At step 600, a given input current stress magnitude $|I_1|$ and output current stress magnitude $|I_L|$ may be specified. When $|I_1|$ and $|I_L|$ are specified, the current stress ratio $|I_1|:|I_L|$ can be computed. From this ratio, an assumed phase offset θ and output matching impedance $Z_L$ can be calculated using the following equations:

$$\frac{I_1}{I_L} = \left|\frac{I_1}{I_L}\right| e^{j\theta} \quad (9)$$

$$Z_L = \frac{\frac{I_1}{I_L} - d}{c} \quad (10)$$

$$Z_{in} = \frac{aZ_L + b}{cZ_L + d} \quad (11)$$

where phase θ is equal to the phase difference between the RF input current stress and the RF output current stress. At step 602, current phase θ may be swept from −180° to 180° while computing $Z_L$ and Zin using equations 10 and 11, respectively. At step 604, the acceptable range of current phase θ may be limited to values for which Rin and $R_L$ are positive.

Assuming the conjugate matching condition which sets Zin equal to $Z_G^*$, the available source power Pavs can be expressed in terms of input current stress as follows:

$$P_{avs} = \frac{R_{in}}{2}|I_1|^2 \quad (12)$$

In order to reduce source power, a phase θ should be selected that minimizes Pavs (e.g., θ is selected that minimizes Rin), as indicated in step 606.

Figure 20:
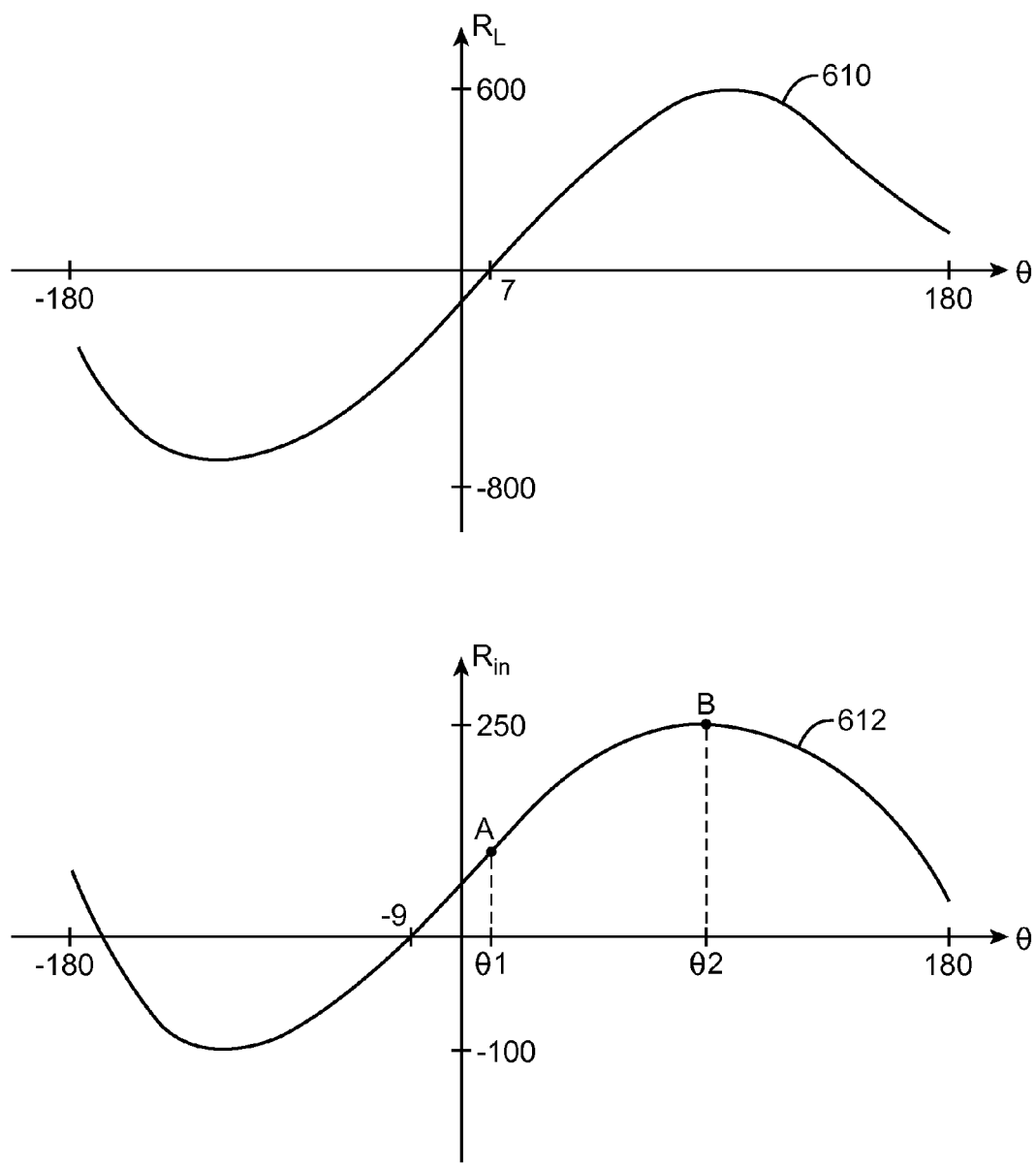
FIG. 20 shows plots illustrating how selection of input-output RF current phase offset affects source power in accordance with an embodiment of the present invention.

FIG. 20 shows plots of Rin and $R_L$ as a function of input-output current stress ratio phase θ. In particular, curve 610 represents the magnitude of $R_L$ as a function of θ, whereas curve 612 represents the magnitude of Rin as a function of θ. According to curve 610, $R_L$ is only positive for θ greater than seven degrees. According to curve 612, Rin is only positive for θ greater than −9 degrees. Acceptable values for θ are therefore limited to an overlapping region (e.g., θ should be between 7° and 180°). Within this acceptable range, various values of θ can be selected.

In the example of FIG. 20, a phase of θ1 corresponding to point A on curve 612 may yield a Pavs that is less than that yielded by a phase of θ2 corresponding to point B on curve 612 (since point A is less than point B). In this example, θ1 may be equal to seven degrees. Ideally, θ should be chosen so as to yield the minimum corresponding value on curve 612 while providing satisfactory voltage stress levels. Once phase θ has been selected, the input and output matching networks can then be designed.

Figure 21A:
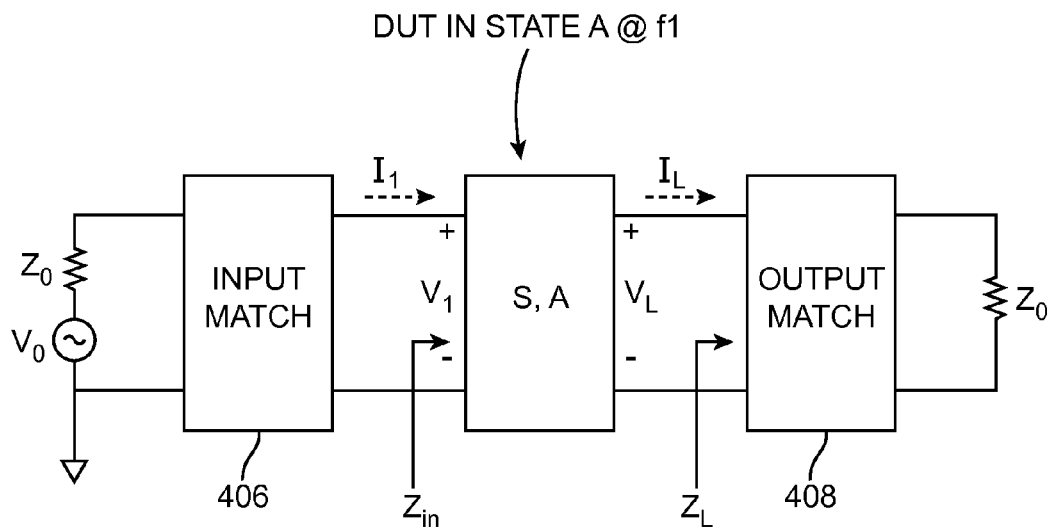
FIGS. 21A and 21B are diagrams showing equivalent circuit models of a test system that is used for testing an antenna tuning element that is placed in a first state when operating at a first frequency and that is placed in a second state when operating at a second frequency in accordance with an embodiment of the present invention.
Figure 21B:
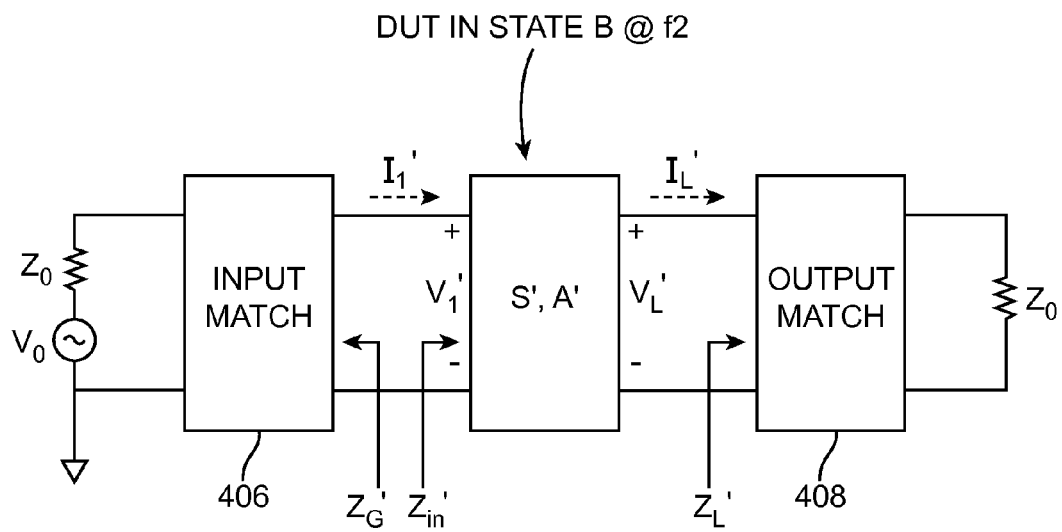

In yet another suitable embodiment, the magnitude of the voltage stress $|V_1|$ at the input of DUT 100 in a first state A for operation at a first frequency f1 can be specified (see, e.g., FIG. 21A) and the magnitude of the current stress $|I_1'|$ and $|I_L'|$ at the input and output of DUT 100 in a second state B for operation at a second frequency f2 (see, e.g., FIG. 21B) can be specified. Input matching network 406 and output matching network 408 should be designed to support testing at both frequencies f1 and f2.

Figure 22:
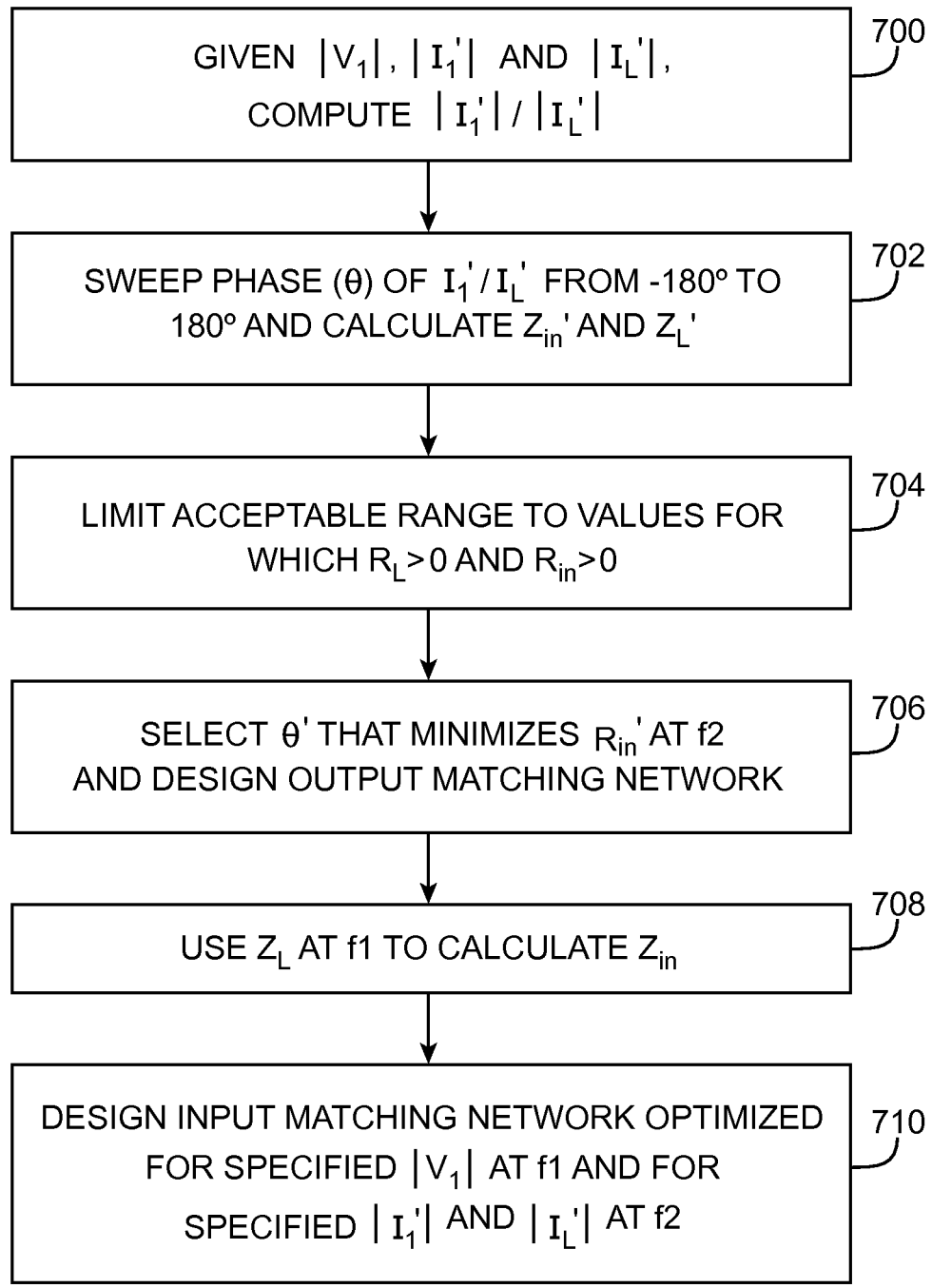
FIG. 22 is a flow chart of illustrative steps involved in designing the input-output matching network circuitries of FIGS. 21A and 21B that are suitable for applying a predetermined input RF voltage stress level when the antenna tuning element is placed in the first state (when operating at the first frequency) and for applying predetermined input and output RF current stress levels when the antenna tuning element is placed in the second state (when operating at the second frequency) in accordance with an embodiment of the present invention.

FIG. 22 is a flow chart of illustrative steps involved in designing the input and output matching networks optimized to provide the desired voltage stress at the input of DUT 100 when DUT 100 is placed in first state A for operation at frequency f1 and further optimized to provide the desired current stress $|I_1'|$ and $|I_L'|$ at the input and output of DUT 100 when DUT 100 is placed in second state B for operation at frequency f2 with minimal source power.

At step 700, a given input voltage stress magnitude $|V_1|$ for testing DUT 100 in state A at f1 and a given input current stress magnitude $|I_1'|$ and output current stress magnitude $|I_L'|$ for testing DUT 100 in state B at f2 may be specified. When $|I_1'|$ and $|I_L'|$ are specified, current the ratio $|I_1'|:|I_L'|$ can be computed. From this ratio, an assumed phase offset θ' and output matching impedance $Z_L'$ can be calculated using the following equations:

$$\frac{I_1'}{I_L'} = \left|\frac{I_1'}{I_L'}\right| e^{j\theta'} \quad (13)$$

$$Z_L' = \frac{\frac{I_1'}{I_L'} - d'}{c'} \quad (14)$$

$$Z_{in}' = \frac{a' Z_L' + b'}{c' Z_L' 9 + d'} \quad (15)$$

where phase θ' is equal to the phase difference between the RF input current stress and the RF output current stress specified for state B at f2. At step 702, phase θ' may be swept from −180° to 180° while computing $Z_L'$ and Zin' using equations 14 and 15, respectively. At step 704, the acceptable range of phase θ may be limited to values for which Rin and $R_L$ are positive.

Assuming the conjugate matching condition which sets Zin' equal to the conjugate of $Z_G'$, the available source power Pavs' can be expressed in terms of input current stress as follows:

$$P_{avs}' = \frac{R_{in}'}{2} |I_1'|^2 \quad (12)$$

In order to reduce source power, a phase θ' should be selected that minimizes Pavs' (e.g., θ' is selected that minimizes Rin'), as indicated in step 706. Once phase θ' has been selected, output matching network 408 can be designed.

At step 708, $Z_L$ (known after output matching network 408 has been obtained) may be used to calculate Zin at f1. At this point (step 710), optimization operations may be performed for the design of input matching network 406 so that input matching network 406 can provide both $|V1|$ at f1 and $|I1'|$ at f2 at satisfactory power levels (e.g., input matching network 406 should be designed to provide the best possible matching at both frequencies while keeping source power at a minimum).

Figure 23:
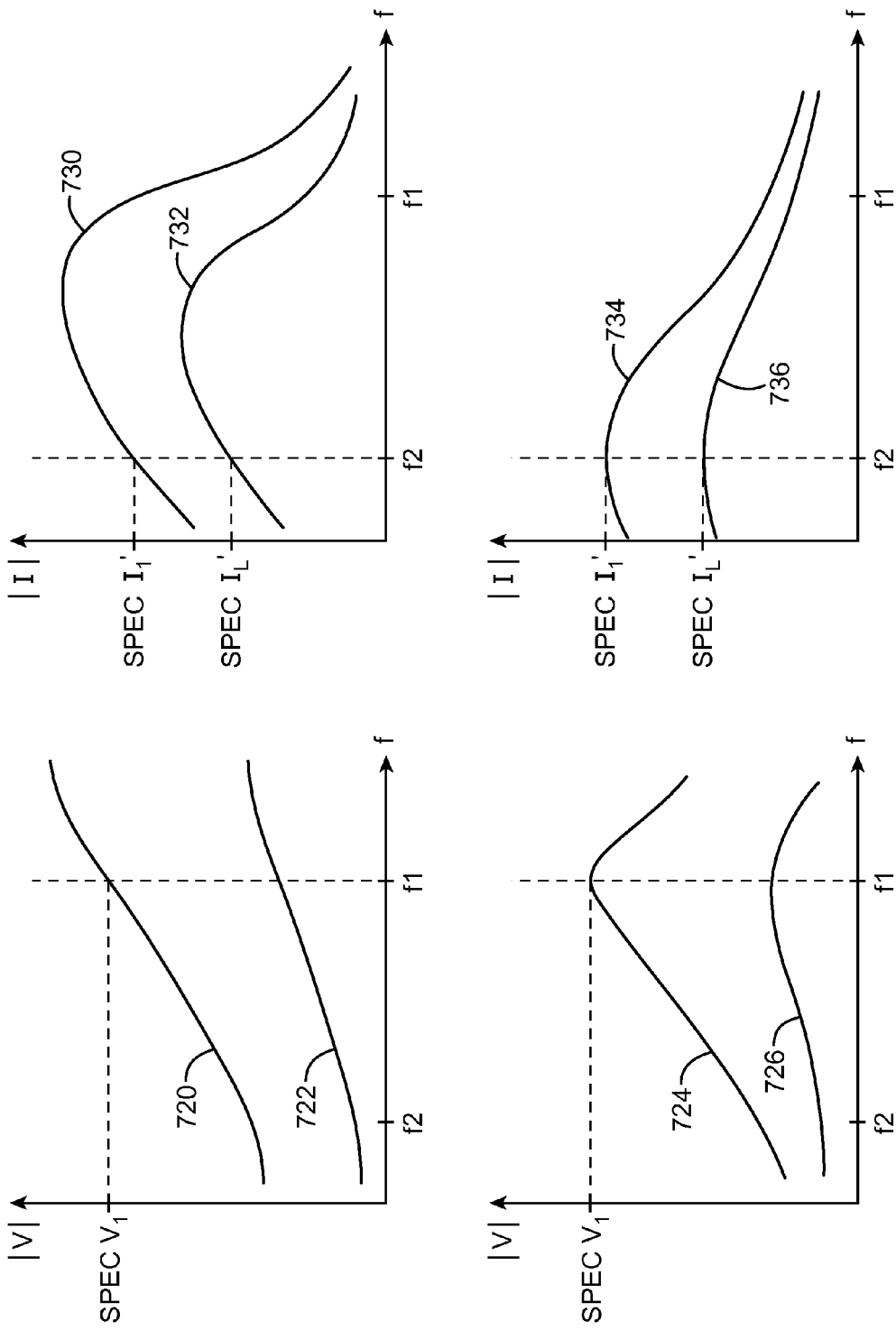
FIG. 23 shows plots illustrating how optimization of the input-output matching network circuitries can help reduce source power consumption in accordance with an embodiment of the present invention.

FIG. 23 shows plots of voltage and current stress levels as a function of frequency before and after the optimization operation of step 710. Curve 720 may represent $|V_1|$ before optimization, whereas curve 722 may represent $|V_L|$ before optimization. Curve 724 may represent $|V_1|$ after optimization, whereas curve 726 may represent $|V_L|$ after optimization. As shown in FIG. 23, curves 720 and 724 are both capable of providing the specified input voltage stress at f1, but curve 724 is able to do so with relatively higher efficiency (e.g., curve 724 exhibits a maximum that is equal to the specified input voltage stress magnitude at f1, which prevents energy from being unnecessarily wasted at other frequencies). In other words, stress levels at frequencies other than f1 are lower than the specified input voltage stress magnitude at f1.

Curve 730 may represent $|I_1'|$ before optimization, whereas curve 732 may represent $|I_L'|$ before optimization. Curve 734 may represent $|I_1'|$ after optimization, whereas curve 736 may represent $|I_L'|$ after optimization. Curves 730 and 734 are both capable of providing the specified input current stress at f2. Similarly, curves 732 and 736 are both capable of providing the specified output current stress at f2. However, optimized curves 734 and 736 are able to do so with relatively higher efficiency without wasting energy at other frequencies (e.g., curves 730 and 732 before optimization expend unnecessarily high amounts of current stress at frequencies other than f2 while curves 734 and 736 after optimization exhibit peaks at f2).

The example described in connection with FIGS. 22 and 23 in which the input voltage stress is specified for one state of DUT 100 at a one frequency and in which the input and output current stress is specified for another state of DUT 100 at another frequency is merely illustrative and does not serve to limit the scope of the present invention. If desired, similar design methodologies may be used to design input and output matching networks for application in testing series-connected DUTs by specifying the input voltage or current stress and/or the output voltage or current stress for DUT 100 at any number of states at desired frequencies of interest.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for using a test system to test a device under test, comprising:
   with a signal generator, outputting radio-frequency test signals in a given frequency band to the device under test; and
   with matching network circuitry interposed between the signal generator and the device under test, applying a first predetermined amount of stress to the device under test in the given frequency band, wherein stress levels in frequency bands other than the given frequency band are at most equal to the first predetermined amount of stress.

2. The method defined in claim 1, wherein applying the first predetermined amount of stress to the device under test comprises applying desired radio-frequency voltage stress onto the device under test.

3. The method defined in claim 1, wherein applying the first predetermined amount of stress to the device under test comprises applying desired radio-frequency current stress onto the device under test.

4. The method defined in claim 1, further comprising:
   placing the device under test in a first state while the signal generator is outputting the radio-frequency test signals in the given frequency band.

5. The method defined in claim 4, further comprising:
   placing the device under test in a second state that is different than the first state; and
   while the device under test is placed in the second state, outputting radio-frequency test signals in another frequency band to the device under test with the signal generator, wherein the matching network circuitry is further configured to apply a second predetermined amount of stress to the device under test in the another frequency band, wherein stress levels in frequency bands other than the another frequency band are at most equal to the second predetermined amount of stress.

6. A test system for characterizing a device under test arranged in a shunt configuration, comprising:
   a signal generator that outputs radio-frequency test signals in a given frequency band to the device under test; and
   matching network circuitry interposed between the signal generator and the device under test, wherein the matching network circuitry is configured to apply a predetermined amount of stress to the device under test in the given frequency band while stress levels in other frequency bands are at most equal to the predetermined amount of stress.

7. The test system defined in claim 6, wherein the device under test comprises an adjustable antenna tuning element.

8. The test system defined in claim 6, further comprising:
   a shunt resistor coupled in parallel with the device under test, wherein the shunt resistor exhibits a resistance that is less than that of the device under test when the device under test is placed in a selected one of a plurality of states.

9. The test system defined in claim 6, wherein the matching network circuitry comprises:
   a first matching circuit configured to apply the predetermined amount of stress to the device under test in the given frequency band; and
   a second matching circuit configured to apply some other predetermined amount of stress to the device under test in another frequency band.

10. The test system defined in claim 6, further comprising:
    radio-frequency power meters coupled to the device under test, wherein the power meters are configured to obtain scattering parameter measurements on the device under test while the predetermined amount of stress is applied to the device under test.

11. The test system defined in claim 6, further comprising:
    a radio-frequency test unit coupled to the device under test, wherein the radio-frequency test unit is configured to obtain harmonic distortion measurements on the device under test while the predetermined amount of stress is applied to the device under test.

12. The test system defined in claim 6, further comprising:
    a power supply unit coupled to the device under test, wherein the power supply unit is configured to monitor how much power is consumed by the device under test while the predetermined amount of stress is applied to the device under test in the given frequency band.

13. A method of using a test system to characterize a radio-frequency device under test having first and second terminals, comprising:
    with a signal generator, outputting radio-frequency test signals at a given frequency to the device under test;
    with first matching network circuitry coupled between the signal generator and the first terminal of the device under test, applying a first predetermined amount of radio-frequency stress to the first terminal of the device under test at the given frequency; and
    with second matching network circuitry coupled to the second terminal of the device under test, applying a second predetermined amount of radio-frequency stress to the second terminal of the device under test at the given frequency.

14. The method defined in claim 13, wherein applying the first predetermined amount of radio-frequency stress comprises applying a first specified amount of radio-frequency voltage stress to the first terminal of the device under test at the given frequency, and wherein applying the second predetermined amount of radio-frequency stress comprises applying a second specified amount of radio-frequency voltage stress to the second terminal of the device under test at the given frequency.

15. The method defined in claim 13, wherein applying the first predetermined amount of radio-frequency stress comprises applying a first specified of radio-frequency current stress to the first terminal of the device under test at the given frequency, and wherein applying the second predetermined amount of radio-frequency stress comprises applying a second specified amount of radio-frequency current stress to the second terminal of the device under test at the given frequency.

16. The method defined in claim 13, wherein stress levels at the first terminal of the device under test at frequencies other than the given frequency are at most equal to the first predetermined amount of radio-frequency stress, and wherein stress levels at the second terminal of the device under test at frequencies other than the given frequency are at most equal to the second predetermined amount of radio-frequency stress.

17. The method defined in claim 13, further comprising:
    placing the device under test in a first state while the device under test is being characterized at the given frequency;
    placing the device under test in a second state that is different than the first state while the device under test is being characterized at another frequency that is different than the given frequency; and
    with a selected one of the first and second matching network circuitries, applying a third predetermined amount of radio-frequency stress to a corresponding terminal of the device under test at the another frequency.

18. A radio-frequency test system for testing an antenna tuning element having first and second terminals, comprising:
- a signal generator that generates radio-frequency test signals to the antenna tuning element;
- an input matching network coupled between the signal generator and the first terminal of the antenna tuning element, wherein the input matching network is optimized to apply a first desired amount of radio-frequency stress to the first terminal of the antenna tuning element; and
- an output matching network coupled to the second terminal of the antenna tuning element, wherein the output matching network is optimized to apply a second desired amount of radio-frequency stress to the second terminal of the antenna tuning element.

19. The radio-frequency test system defined in claim 18, wherein the antenna tuning element comprises at least one adjustable circuit selected from the group consisting of: a radio-frequency switch, a tunable resistive component, a tunable capacitive component, and a tunable inductive component.

20. The radio-frequency test system defined in claim 18, wherein the input matching network is optimized to apply the first desired amount of radio-frequency stress to the first terminal of the antenna tuning element at a given frequency, and wherein the output matching network is optimized to apply the second desired amount of radio-frequency stress to the second terminal of the antenna tuning element at the given frequency.

21. The radio-frequency test system defined in claim 18, further comprising:
- a plurality of power meters that is coupled to the antenna tuning element and that is configured to gather reflection coefficient and forward transfer coefficient information from the antenna tuning element.

22. The radio-frequency test system defined in claim 18, further comprising:
- a radio-frequency spectrum analyzer coupled to the antenna tuning element that is configured to measure harmonic distortion levels generated from the antenna tuning element.

* * * * *